(12) United States Patent
Tokuhara et al.

(10) Patent No.: US 12,266,667 B2
(45) Date of Patent: Apr. 1, 2025

(54) IMAGING DEVICE

(71) Applicant: Panasonic Intellectual Property Management Co., Ltd., Osaka (JP)

(72) Inventors: Takeyoshi Tokuhara, Osaka (JP); Yasuo Miyake, Osaka (JP); Hidenari Kanehara, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 162 days.

(21) Appl. No.: 18/322,621

(22) Filed: May 24, 2023

(65) Prior Publication Data
US 2023/0299098 A1 Sep. 21, 2023

Related U.S. Application Data

(63) Continuation of application No. PCT/JP2021/041249, filed on Nov. 9, 2021.

(30) Foreign Application Priority Data

Dec. 15, 2020 (JP) ................................ 2020-207889

(51) Int. Cl.
*H01L 27/146* (2006.01)
*H04N 25/709* (2023.01)
*H04N 25/77* (2023.01)

(52) U.S. Cl.
CPC .. *H01L 27/14603* (2013.01); *H01L 27/14645* (2013.01); *H04N 25/709* (2023.01); *H04N 25/77* (2023.01)

(58) Field of Classification Search
CPC ...... H04N 25/709; H04N 25/76; H04N 25/77; H01L 27/146; H01L 27/14603; H01L 27/14645
See application file for complete search history.

(56) References Cited

U.S. PATENT DOCUMENTS

| | | | |
|---|---|---|---|
| 11,350,051 B2* | 5/2022 | Shibuta | H01L 27/146 |
| 2016/0119562 A1* | 4/2016 | Takase | H04N 25/75 |
| | | | 348/312 |

(Continued)

FOREIGN PATENT DOCUMENTS

| | | |
|---|---|---|
| JP | 2014-195296 | 10/2014 |
| JP | 2016-086407 | 5/2016 |

(Continued)

OTHER PUBLICATIONS

International Search Report of PCT application No. PCT/JP2021/041249 dated Feb. 8, 2022.

*Primary Examiner* — Lin Ye
*Assistant Examiner* — Chriss S Yoder, III
(74) *Attorney, Agent, or Firm* — Rimon P.C.

(57) ABSTRACT

An imaging device includes a photoelectric conversion layer that includes a first surface and a second surface opposite the first surface and that generates signal charge, at least one pixel electrode located on the first surface of the photoelectric conversion layer, a control electrode located on the first surface of the photoelectric conversion layer, a counter electrode located on the second surface of the photoelectric conversion layer and opposite the at least one pixel electrode and the control electrode, and a charge accumulator that is connected to the at least one pixel electrode and that accumulates the signal charge. There is a line segment connecting two points on the at least one pixel electrode to each other and overlapping the control electrode in plan view.

12 Claims, 15 Drawing Sheets

(56) References Cited

U.S. PATENT DOCUMENTS

2018/0151620 A1    5/2018  Tashiro
2019/0198546 A1*  6/2019  Kato ................. H01L 27/14603
2021/0136309 A1*  5/2021  Koga ..................... H04N 25/76

FOREIGN PATENT DOCUMENTS

JP       2018-093298      6/2018
JP       2019-054499      4/2019

\* cited by examiner

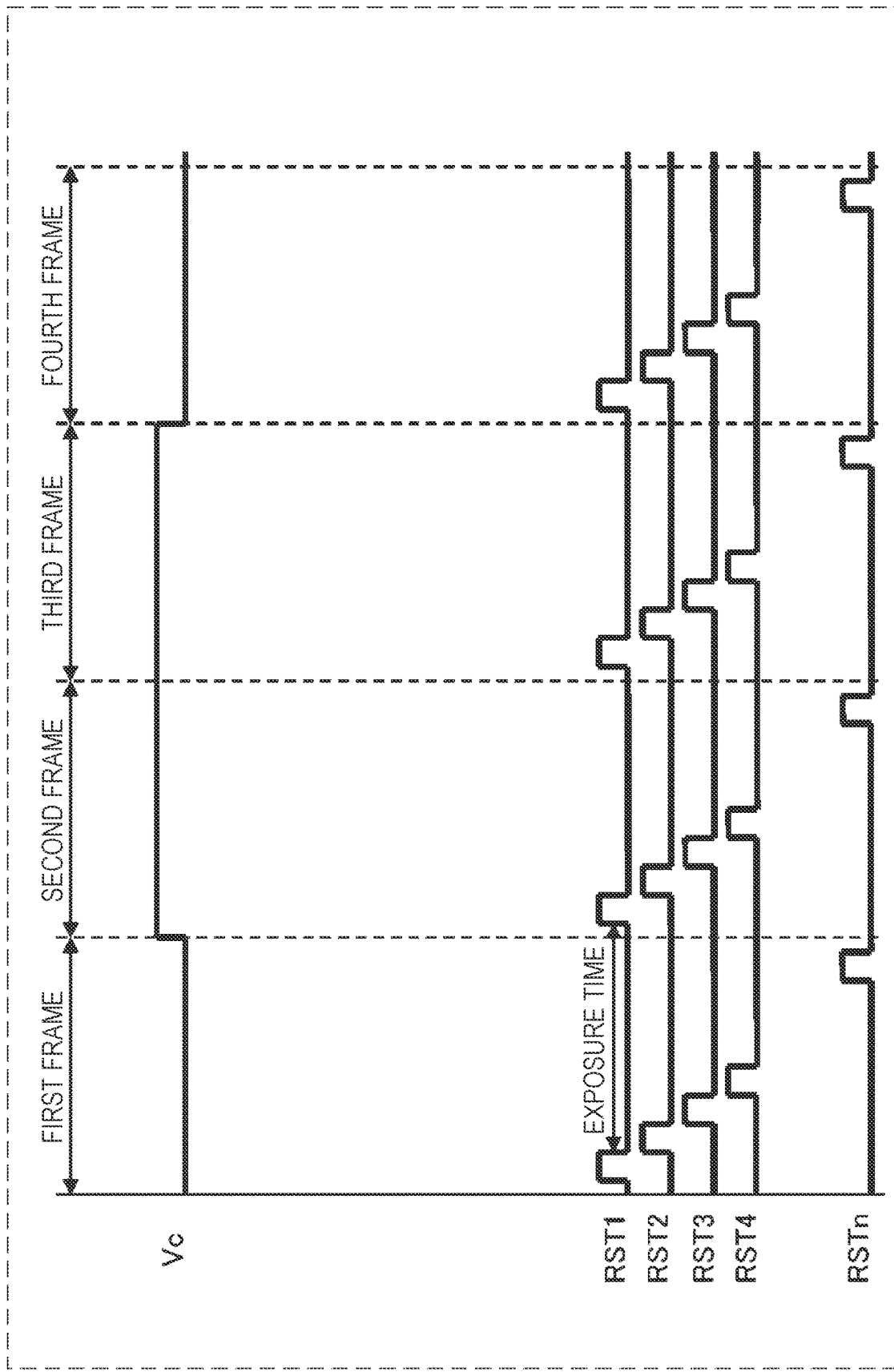

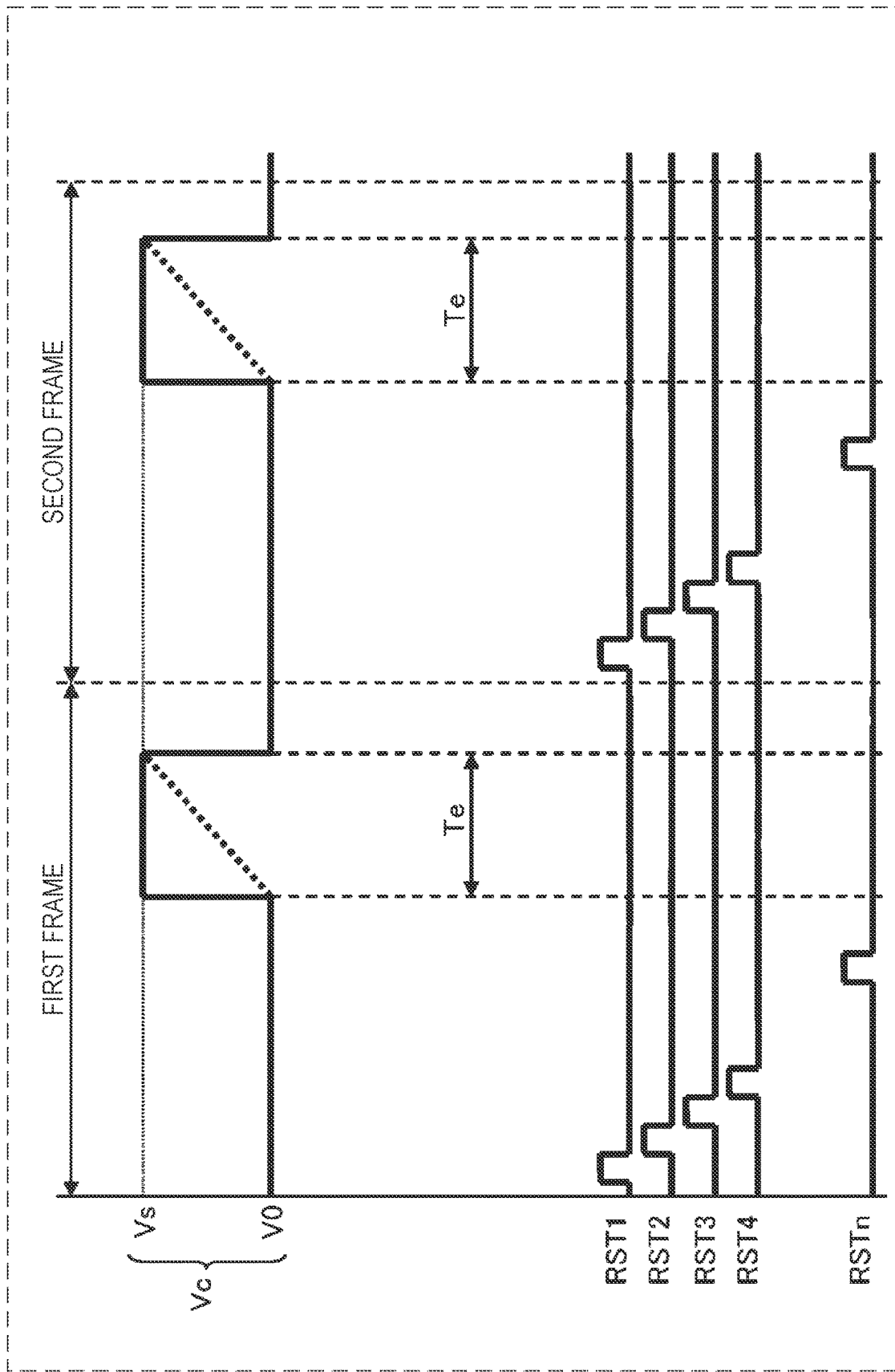

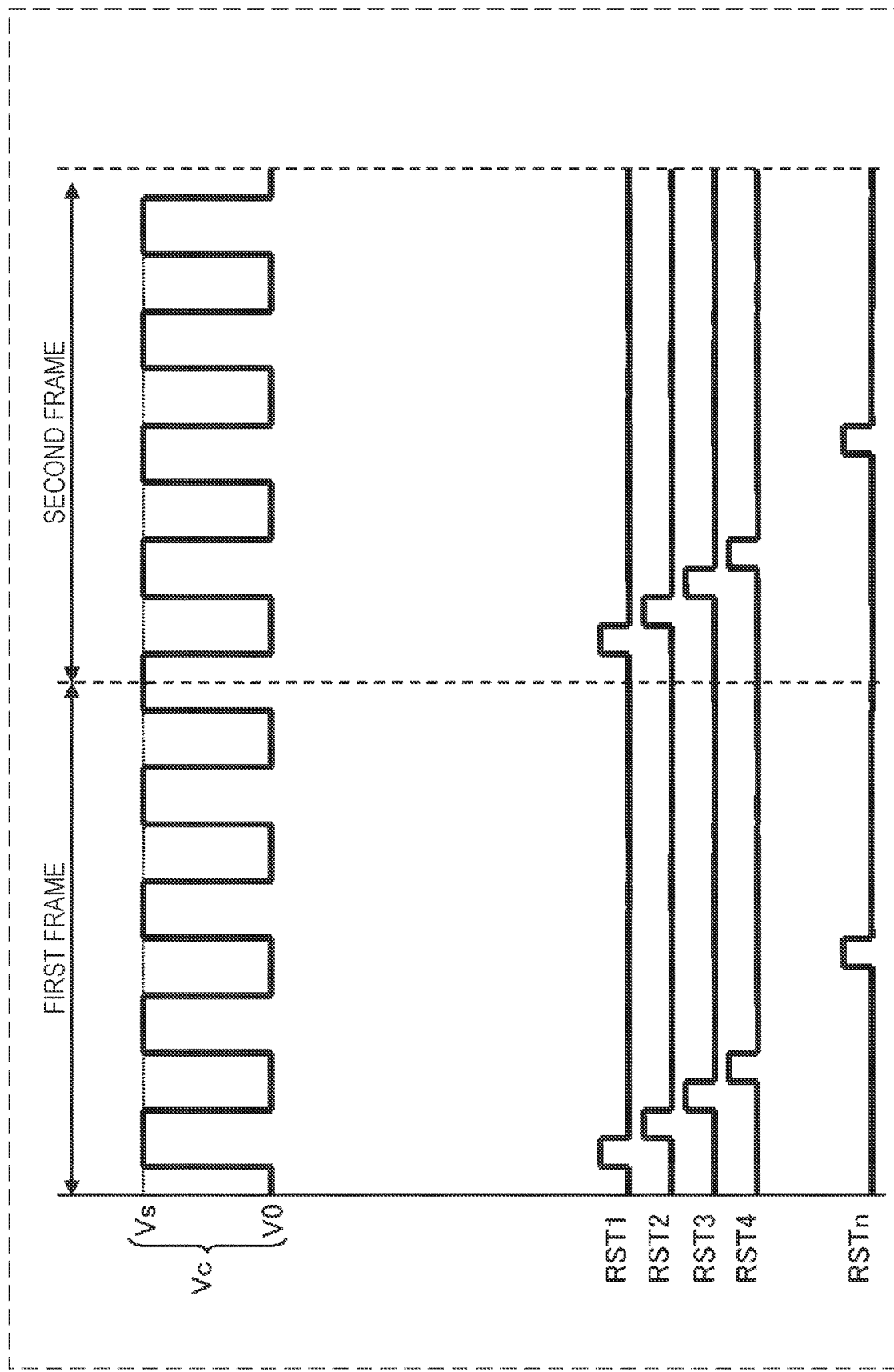

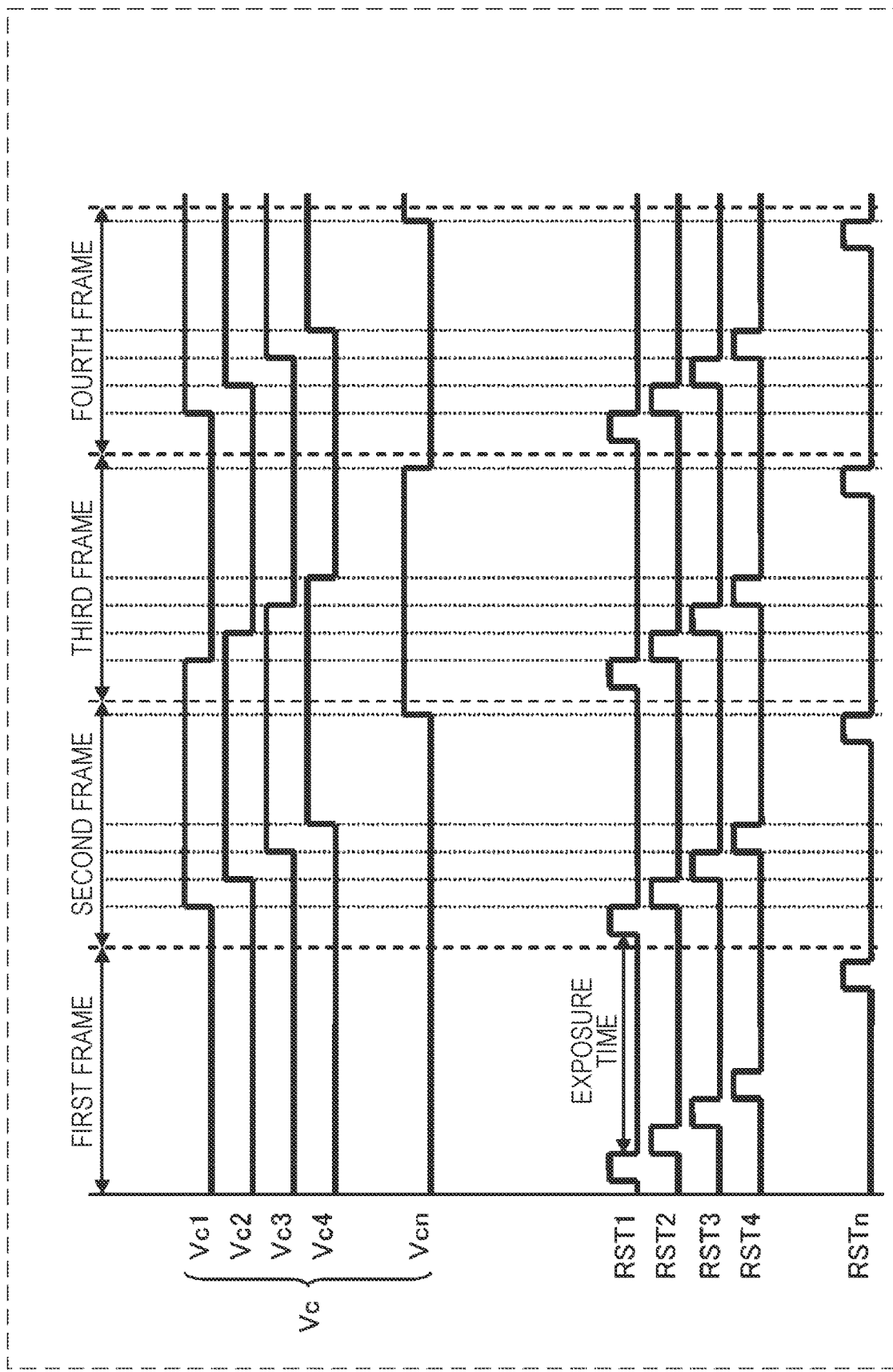

IMAGING DEVICE

BACKGROUND

1. Technical Field

The present disclosure relates to an imaging device.

2. Description of the Related Art

Japanese Unexamined Patent Application Publication No. 2019-54499 and Japanese Unexamined Patent Application Publication No. 2016-86407 disclose multilayer imaging devices with variable sensitivity.

SUMMARY

In one general aspect, the techniques disclosed here feature an imaging device including a photoelectric conversion layer that includes a first surface and a second surface opposite the first surface and that generates signal charge, at least one pixel electrode located on the first surface of the photoelectric conversion layer, a control electrode for controlling sensitivity of the imaging device, the control electrode being located on the first surface of the photoelectric conversion layer, a counter electrode located on the second surface of the photoelectric conversion layer and opposite the at least one pixel electrode and the control electrode, and a charge accumulator that is connected to the at least one pixel electrode and that accumulates the signal charge. There is a line segment connecting two points on the at least one pixel electrode to each other and overlapping the control electrode in plan view.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 13 is a timing chart illustrating an example of an operation of the imaging device according to the first embodiment;

FIG. 14 is a timing chart illustrating another example of the operation of the imaging device according to the first embodiment;

FIG. 15 is a timing chart illustrating yet another example of the operation of the imaging device according to the first embodiment; and FIG. 16 is a timing chart illustrating yet another example of the operation of the imaging device according to the first embodiment.

DETAILED DESCRIPTIONS

Figure 1:
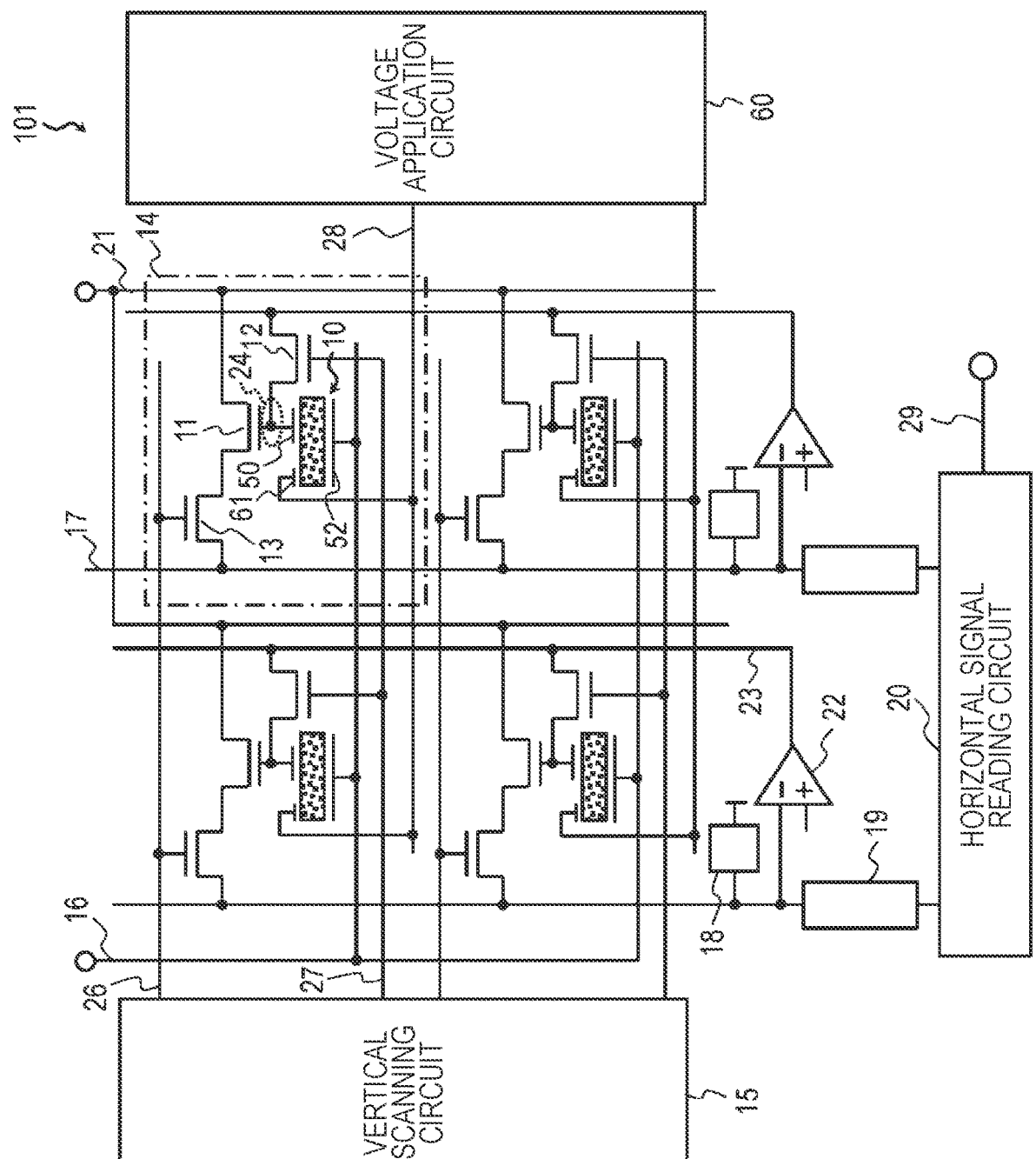
FIG. 1 is a diagram schematically illustrating an example of the circuit configuration of an imaging device according to a first embodiment.

Underlying Knowledge Forming Basis of Present Disclosure

In a technique described in Japanese Unexamined Patent Application Publication No. 2019-54499, sensitivity is changed by changing a voltage of a counter electrode. Because a potential of a pixel electrode changes as signal charge accumulates, however, sensitivity is not maintained constant with respect to the voltage of the counter electrode. That is, even if the potential of the counter electrode is set to a certain value, sensitivity undesirably changes as signal charge accumulates.

In a technique described in Japanese Unexamined Patent Application Publication No. 2016-86407, a shield electrode is provided around a pixel electrode, and sensitivity is changed by changing a voltage applied to the shield electrode. Because the shield electrode is provided between pixels, however, it is difficult to change sensitivity over a wide range even if the voltage applied to the shield electrode is changed.

In view of the above problems, the present inventors focused upon shapes and arrangement of a pixel electrode and a shield electrode and conceived the present disclosure. The present disclosure provides an imaging device capable of varying sensitivity over a wide range while maintaining the sensitivity substantially constant with respect to an applied voltage by employing shapes and arrangement of a pixel electrode and a control electrode that satisfy certain conditions.

An outline of the present disclosure is as follows.

An imaging device according to an aspect of the present disclosure includes a photoelectric conversion layer that includes a first surface and a second surface opposite the first surface and that generates signal charge, at least one pixel electrode located on the first surface of the photoelectric conversion layer, a control electrode for controlling sensitivity of the imaging device, the control electrode being located on the first surface of the photoelectric conversion layer, a counter electrode located on the second surface of the photoelectric conversion layer and opposite the at least one pixel electrode and the control electrode, and a charge accumulator that is connected to the at least one pixel electrode and that accumulates the signal charge. There is a line segment connecting two points on the at least one pixel electrode to each other and overlapping the control electrode in plan view.

As a result, sensitivity of the imaging device can be varied while maintaining the sensitivity of the imaging device substantially constant with respect to an applied voltage.

In addition, for example, the at least one pixel electrode may surround the control electrode in plan view.

In addition, for example, the control electrode may overlap, in plan view, a center of a smallest circle completely containing the at least one pixel electrode.

As a result, sensitivity of the imaging device can be varied over a wider range while maintaining the sensitivity of the imaging device substantially constant with respect to an applied voltage.

In addition, for example, the imaging device may further include a microlens located above the second surface.

In addition, for example, the control electrode may overlap, in plan view, a point at which the microlens is thickest.

As a result, incident light can be collected in a region affected by the voltage applied to the control electrode. Sensitivity of the imaging device, therefore, can be varied over a wider range.

In addition, for example, the photoelectric conversion layer may include an organic material.

In addition, for example, the imaging device may further include a shield electrode that is located on the first surface and that surrounds the at least one pixel electrode and the control electrode in plan view.

As a result, color mixing between adjacent unit pixel cells can be suppressed.

In addition, for example, the control electrode may be electrically connected to the shield electrode.

As a result, the same voltage is used for the shield electrode and the control electrode, and the number of power supplies can be reduced.

In addition, for example, the imaging device may further include a voltage supply circuit. The signal charge may be a hole. The voltage supply circuit may supply a first voltage to the counter electrode and a second voltage, which is lower than the first voltage, to the control electrode.

As a result, the amount of signal charge to be collected in the pixel electrode can be controlled by the voltage applied to the control electrode. That is, sensitivity of the imaging device can be varied by the voltage applied to the control electrode.

In addition, the voltage supply circuit may supply the second voltage to the control electrode in a first frame period and a third voltage, which is lower than the second voltage, to the control electrode in a second frame period that is different from the first frame period.

As a result, sensitivity of the imaging device can be made different between frames.

An imaging device according to another aspect of the present disclosure includes a photoelectric conversion layer that includes a first surface and a second surface opposite the first surface and that generates signal charge, at least one pixel electrode located on the first surface of the photoelectric conversion layer, a control electrode for controlling sensitivity of the imaging device, the control electrode being located on the first surface of the photoelectric conversion layer, a counter electrode located on the second surface of the photoelectric conversion layer and opposite the at least one pixel electrode and the control electrode, and a charge accumulator that is connected to the at least one pixel electrode and that accumulates the signal charge. The control electrode overlaps, in plan view, a center of a smallest circle completely containing the at least one pixel electrode.

As a result, sensitivity of the imaging device can be varied over a wide range while maintaining the sensitivity of the imaging device substantially constant with respect to the applied voltage.

An imaging device according to another aspect of the present disclosure includes a photoelectric conversion layer that includes a first surface and a second surface opposite the first surface and that generates signal charge, at least one pixel electrode located on the first surface of the photoelectric conversion layer, a control electrode for controlling sensitivity of the imaging device, the control electrode being located on the first surface of the photoelectric conversion layer, a counter electrode located on the second surface of the photoelectric conversion layer and opposite the at least one pixel electrode and the control electrode, a microlens located above the second surface of the photoelectric conversion layer, and a charge accumulator that is connected to the at least one pixel electrode and that accumulates the signal charge. The control electrode overlaps, in plan view, a point at which the microlens is thickest.

As a result, sensitivity of the imaging device can be varied over a wide range while maintaining the sensitivity of the imaging device substantially constant with respect to the applied voltage.

An embodiment of the present disclosure will be described in detail hereinafter with reference to the drawings.

The embodiment described hereinafter is a general or specific example. Values, shapes, materials, components, arrangement and connection modes of the components, steps, order of the steps, and the like mentioned in the following embodiment are examples, and not intended to limit the present disclosure. Various modes described herein may be combined together in any manner insofar as no contradiction is caused. Among the components in the following description, ones not described in the independent claims, which define broadest concepts, will be described as optional components. In the following description, components having substantially the same functions will be given the same reference numerals, and description thereof might be omitted.

The drawings are schematic diagrams, and not necessarily strict illustrations. Scales, for example, are not consistent between the drawings.

A "plan view" herein refers to a view from a direction perpendicular to a semiconductor substrate.

First Embodiment

An imaging device according to a first embodiment will be described with reference to FIGS. 1 to 3.

Structure of Imaging Device 101

FIG. 1 schematically illustrates an example of the circuit configuration of an imaging device 101 according to the first embodiment. The imaging device 101 includes a plurality of unit pixel cells 14 and peripheral circuits.

The unit pixel cells 14 are arranged on the semiconductor substrate in two dimensions, that is, in a row direction and a column direction, and form a photosensitive region (pixel region). The imaging device 101 may be a line sensor, and the unit pixel cells 14 may be arranged in one direction, instead. The row direction and column direction herein refer to directions in which rows and columns extend, respectively. That is, in FIG. 1, a vertical direction is the column direction, and a horizontal direction is the row direction.

The unit pixel cells 14 each include a photoelectric converter 10, an amplifier transistor 11, a reset transistor 12, and an address transistor 13. As described in detail hereinafter, the photoelectric converter 10 includes a pixel electrode 50, a control electrode 61, and a counter electrode 52 in the present embodiment. By adjusting a voltage applied to the control electrode 61, the amount of signal charge, which is generated through photoelectric conversion, captured by the pixel electrode 50 is adjusted. That is, sensitivity of the imaging device 101 is adjusted.

The imaging device 101 includes a voltage application circuit 60 as an example of a voltage supply circuit. The voltage application circuit 60 is configured to be able to apply, when the imaging device 101 operates, at least two different voltages to the control electrode 61 simultaneously or selectively. It is only required that the voltage application circuit 60 include a mechanism for changing the voltage supplied to the control electrode 61. The circuit configuration of the voltage application circuit 60 is not particularly limited. For example, the voltage application circuit 60 may include a mechanism for converting a voltage supplied from a voltage source into a certain voltage. Alternatively, the voltage application circuit 60 may be configured to generate a certain voltage. The voltage supplied to the control electrode 61 from the voltage application circuit 60 will be hereinafter referred to as a sensitivity adjusting voltage Vc. The voltage application circuit 60 supplies the sensitivity adjusting voltage Vc based on an instruction from an operator of the imaging device 101 or an instruction from another control circuit included in the imaging device 101 to the control electrode 61 through a sensitivity adjusting line 28. The voltage application circuit 60 is typically provided outside the photosensitive region as part of the peripheral circuits. Although one sensitivity adjusting line 28 is provided for each row in FIG. 1, how the sensitivity adjusting line 28 is provided is not limited to this. For example, one sensitivity adjusting line 28 may be provided for all pixels or for each pixel, instead. When one sensitivity adjusting line 28 is provided for each row, the sensitivity adjusting voltage Vc may be individually changed for each row or simultaneously changed for all the rows.

The pixel electrode 50 is connected to a gate electrode of the amplifier transistor 11. Signal charge collected by the pixel electrode 50 is accumulated in a charge accumulation node 24 located between the pixel electrode 50 and the gate electrode of the amplifier transistor 11. Although signal charge is holes in the present embodiment, signal charge may be electrons, instead.

The signal charge accumulated in the charge accumulation node 24 is applied to the gate electrode of the amplifier transistor 11 as a voltage based on the amount of signal charge. The amplifier transistor 11 amplifies the voltage. The address transistor 13 selectively reads a signal voltage. A source electrode or a drain electrode of the reset transistor 12 is connected to the pixel electrode 50. The reset transistor 12 resets the signal charge accumulated in the charge accumulation node 24. In other words, the reset transistor 12 resets the gate electrode of the amplifier transistor 11 and a potential of the pixel electrode 50.

In order to selectively perform the above-described operation for the plurality of the unit pixel cells 14, the imaging device 101 includes power supply lines 21, vertical signal lines 17, address signal lines 26, and reset signal lines 27. These lines are each connected to the unit pixel cells 14. The power supply lines 21 are connected to source electrodes or drain electrodes of the amplifier transistors 11. The vertical signal lines 17 are connected to source electrodes or drain electrodes of the address transistors 13. The address signal lines 26 are connected to gate electrodes of the address transistors 13. The reset signal lines 27 are connected to gate electrodes of the reset transistors 12.

The imaging device 101 includes photoelectric converter control lines 16 for applying a certain voltage to the photoelectric converters 10. The voltage supplied to the photoelectric converters 10 through the photoelectric converter control lines 16 may be the same between all the photoelectric converters 10. The voltage supplied to the photoelectric converters 10 through the photoelectric converter control lines 16 may be a fixed voltage or a voltage that varies over time.

In the configuration illustrated in FIG. 1, the peripheral circuits include a vertical scanning circuit 15, a horizontal signal reading circuit 20, a plurality of column signal processing circuits 19, a plurality of load circuits 18, and a plurality of inverting amplifiers 22. The vertical scanning circuit 15 is also called a row scanning circuit. The horizontal signal reading circuit 20 is also called a column scanning circuit. The column signal processing circuits 19 are also called row signal accumulation circuits. The inverting amplifiers 22 are also called feedback amplifiers.

The vertical scanning circuit 15 is connected to the address signal lines 26 and the reset signal lines 27. The vertical scanning circuit 15 selects the unit pixel cells 14 arranged in each row in units of rows, reads signal voltages, and resets potentials of the pixel electrodes 50. The power supply lines 21 are used to supply a certain power supply voltage to the amplifier transistors 11 of the unit pixel cells 14. The horizontal signal reading circuit 20 is electrically connected to the column signal processing circuits 19. The column signal processing circuits 19 are each electrically connected, through the vertical signal line 17 corresponding to each column, to the unit pixel cells 14 arranged in the column. The load circuits 18 are electrically connected to the vertical signal lines 17. The load circuits 18 and the amplifier transistors 11 form source follower circuits.

The inverting amplifiers 22 are provided in correspondence with the columns. A negative input terminal of each of the inverting amplifiers 22 is connected to a corresponding one of the vertical signal lines 17. An output terminal of each of the inverting amplifiers 22 is connected to corresponding ones of the unit pixel cells 14 through a feedback line 23 for a corresponding column.

The vertical scanning circuit 15 applies row selection signals for turning on or off the address transistors 13 to gate electrodes of the address transistors 13 through the address signal lines 26. As a result, rows to be read are scanned and selected. Signal voltages are read from the unit pixel cells 14 in the selected rows to the corresponding vertical signal lines 17. The vertical scanning circuit 15 also applies reset signals for turning on or off the reset transistors 12 to the gate electrodes of the reset transistors 12 through the reset signal lines 27. As a result, rows of the unit pixel cells 14 to be reset are selected. The vertical signal lines 17 transfer signal voltages read from the unit pixel cells 14 selected by the vertical scanning circuit 15 to the column signal processing circuits 19.

The column signal processing circuits 19 perform, for example, noise reduction signal processing, which is typified by correlated double sampling, and analog-to-digital (A/D) conversion.

The horizontal signal reading circuit 20 sequentially reads signals from the column signal processing circuits 19 to a horizontal common signal line 29.

The inverting amplifiers 22 are connected to the drain electrodes of the reset transistors 12 through feedback lines 23. The inverting amplifiers 22, therefore, receive outputs of the address transistors 13 with negative terminals thereof when the address transistors 13 and the reset transistors 12 are in conduction. The inverting amplifiers 22 perform a feedback operation so that gate potentials of the amplifier transistors 11 become a certain feedback voltage. Output voltages of the inverting amplifiers 22 at this time are 0 V or a positive voltage close to 0 V. The feedback voltage refers to output voltages of the inverting amplifiers 22.

Device Structure of Unit Pixel Cells 14

Figure 2:
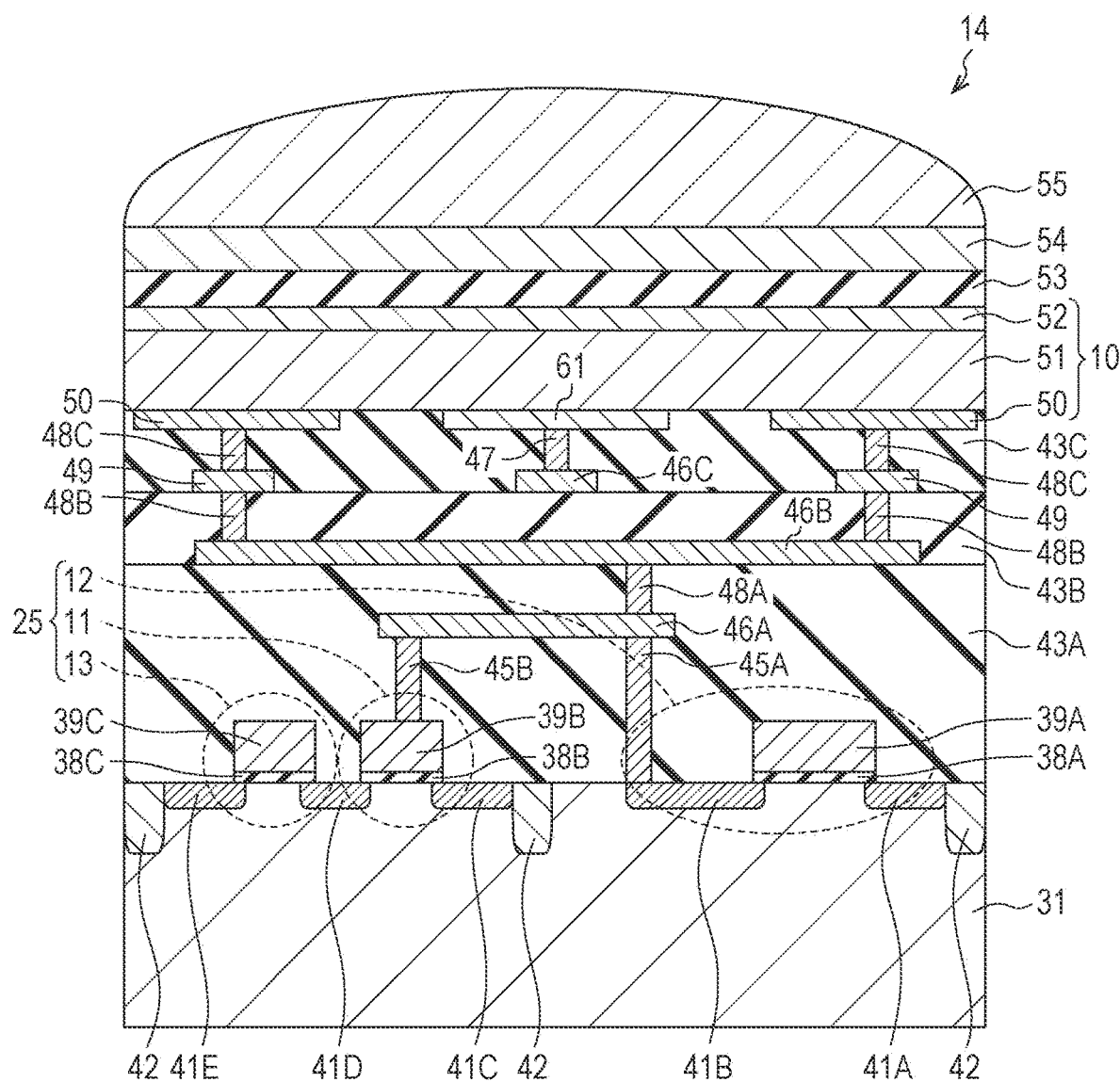
FIG. 2 is a cross-sectional view schematically illustrating the device structure of a unit pixel cell in the imaging device according to the first embodiment.

FIG. 2 is a cross-sectional diagram schematically illustrating a cross-section of the device structure of one of the unit pixel cells 14 in the imaging device 101 according to the present embodiment.

The unit pixel cell 14 includes a semiconductor substrate 31, a charge detection circuit 25, a photoelectric converter 10, a sealing film 53, a color filter 54, and a microlens 55. The semiconductor substrate 31 is, for example, a p-type silicon substrate. The charge detection circuit 25 detects signal charge captured by a pixel electrode 50 and outputs a signal voltage. The charge detection circuit 25 includes an amplifier transistor 11, a reset transistor 12, and an address transistor 13 and is formed on the semiconductor substrate 31.

The amplifier transistor 11 is formed on the semiconductor substrate 31 and includes n-type impurity regions 41C and 41D that function as a drain and a source, respectively, a gate insulating layer 38B on the semiconductor substrate 31, and a gate electrode 39B on the gate insulating layer 38B.

The reset transistor 12 is formed on the semiconductor substrate 31 and includes n-type impurity regions 41B and 41A that function as a drain and a source, respectively, a gate insulating layer 38A on the semiconductor substrate 31, and a gate electrode 39A on the gate insulating layer 38A.

The address transistor 13 is formed on the semiconductor substrate 31 and includes n-type impurity regions 41D and 41E that function as a drain and a source, respectively, a gate insulating layer 38C on the semiconductor substrate 31, and a gate electrode 39C on the gate insulating layer 38C. The n-type impurity region 41D is shared by the amplifier transistor 11 and the address transistor 13, thereby connecting the amplifier transistor 11 and the address transistor 13 in series with each other.

In the semiconductor substrate 31, device separating regions 42 are provided between adjacent unit pixel cells 14 and between the amplifier transistor 11 and the reset transistor 12. The device separating regions 42 electrically separate the adjacent unit pixel cells 14. A leak of signal charge accumulated in the charge accumulation node 24 is also suppressed.

Interlayer insulating layers 43A, 43B, and 43C are stacked on a surface of the semiconductor substrate 31. In the interlayer insulating layer 43A, a contact plug 45A connected to the n-type impurity region 41B of the reset transistor 12, a contact plug 45B connected to the gate electrode 39B of the amplifier transistor 11, and a wire 46A connecting the contact plug 45A and the contact plug 45B to each other are provided. As a result, the n-type impurity region 41B, which is the drain of the reset transistor 12, is electrically connected to the gate electrode 39B of the amplifier transistor 11.

The photoelectric converter 10 is provided on the interlayer insulating layer 43C. The photoelectric converter 10 includes a counter electrode 52, a photoelectric conversion layer 51, a pixel electrode 50, and a control electrode 61. The photoelectric conversion layer 51 is sandwiched by the counter electrode 52 and a combination of the pixel electrode 50 and the control electrode 61. The pixel electrode 50 and the control electrode 61 are provided on the interlayer insulating layer 43C. The counter electrode 52 is composed of, for example, a transparent conductive material such as indium tin oxide (ITO). The pixel electrode 50 and the control electrode 61 are composed of, for example, a metal such as aluminum or copper or conductive polysilicon doped with impurities.

The sealing film 53 is an insulating film provided on the counter electrode 52. The color filter 54 is provided on the sealing film 53 and selectively transmits light in a certain wavelength range. The color filter 54 corresponds to, for example, one of three primary colors of RGB or infrared radiation (IR). The microlens 55 is a convex lens that is provided on the color filter 54 and that collects incident light.

As illustrated in FIG. 2, the control electrode 61 is connected, through a plug 47 provided in the interlayer insulating layer 43C, to a wire 46C provided on the interlayer insulating layer 43B. The wire 46C is connected to the sensitivity adjusting line 28 illustrated in FIG. 1. The pixel electrode 50 is connected to the wire 46A through a plug 48C provided in the interlayer insulating layer 43C, a wire 49 provided on the interlayer insulating layer 43B, a plug 48B, a wire 46B, and a plug 48A. The wire 46A is also connected to the n-type impurity region 41B through the contact plug 45A and to the gate electrode 39B of the amplifier transistor 11 through the contact plug 45B. These plugs, contact plugs, and wires are composed of a metal such as aluminum or copper, conductive polysilicon doped with impurities, or the like.

In the present embodiment, the imaging device 101 detects, from hole-electron pairs generated through photoelectric conversion in the photoelectric conversion layer 51, holes as signal charge. The detected signal charge is accumulated in the charge accumulation node 24 (refer to FIG.

1) illustrated in FIG. 1. The charge accumulation node 24 includes the pixel electrode 50, the gate electrode 39B, the n-type impurity region 41B, and the plugs 48A, 48B, and 48C, the contact plugs 45A and 45B, and the wires 49, 46B, and 46A (refer to FIG. 2) connecting the pixel electrode 50, the gate electrode 39B, and the n-type impurity region 41B to one another. The charge accumulation node 24 corresponds to a charge accumulator.

The photoelectric conversion layer 51 covers the control electrode 61 and the pixel electrode 50 on the interlayer insulating layer 43C and is continuously formed over the plurality of unit pixel cells 14. The photoelectric conversion layer 51 is composed of, for example, an organic material or amorphous silicon. The photoelectric conversion layer 51 may include a charge clocking layer at an interface with the electrodes.

Although not illustrated in FIG. 2, the vertical scanning circuit 15, the horizontal signal reading circuit 20, the column signal processing circuits 19, the load circuits 18, and the inverting amplifiers 22 illustrated in FIG. 1 are also formed on the semiconductor substrate 31.

The imaging device 101 can be fabricated through a general semiconductor fabrication process. In particular, when a silicon substrate is used as the semiconductor substrate 31, the imaging device 101 can be fabricated through one of various silicon semiconductor processes.

The control electrode 61 and the pixel electrode 50 may be formed simultaneously or separately. The pixel electrode 50 is in direct contact with the photoelectric conversion layer 51. The control electrode 61 may be in direct contact with the photoelectric conversion layer 51, or an insulating film may be provided between the control electrode 61 and the photoelectric conversion layer 51.

Next, an example of arrangement of the control electrode 61 and the pixel electrode 50 will be described.

Figure 3:
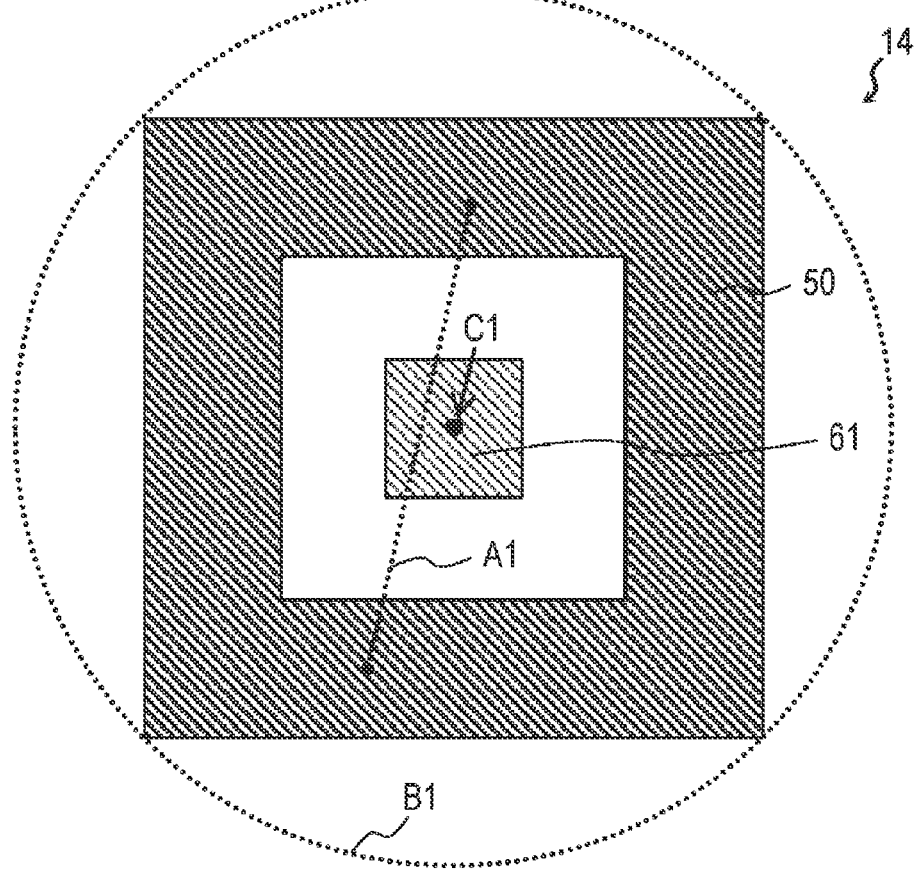
FIG. 3 is a plan view illustrating a pixel electrode and a control electrode in the imaging device according to the first embodiment.

FIG. 3 is a plan view illustrating the pixel electrode 50 and the control electrode 61 in the imaging device 101 according to the first embodiment. In FIG. 3, a line segment A1 and a circle B1 indicated by broken lines are additional lines for explanation.

In the present embodiment, the control electrode 61 is square and disposed at the center of the unit pixel cell 14. An outer edge of the pixel electrode 50 is square, and the pixel electrode 50 includes a square opening. The control electrode 61 is disposed in the opening in the pixel electrode 50. In the present embodiment, the pixel electrode 50 completely surrounds the control electrode 61, but the pixel electrode 50 need not completely surround the control electrode 61. For example, the pixel electrode 50 may have a C-shape with a part of a ring missing, or may be divided into a plurality of parts, instead.

In the present embodiment, the control electrode 61 overlaps a center point of a smallest circle completely containing the pixel electrode 50 in plan view. In FIG. 3, the circle B1 is the smallest circle completely containing the pixel electrode 50. A point C1 is a center point of the circle B1. As illustrated in FIG. 3, the center point C1 of the circle B1 overlaps the control electrode 61. These conditions mean that the control electrode 61 is located near a central part of the unit pixel cell 14 in plan view. Here, the central part of the unit pixel cell 14 is a region where the microlens 55 collects light, and more signal charge than in a peripheral part of the unit pixel cell 14 is generated. In the present embodiment, therefore, the number of signal charges that can be controlled by the voltage applied to the control electrode 61 increases, and the amount of signal charge collected by the pixel electrode 50 can be greatly varied.

That is, sensitivity can be varied over a wide range by the voltage applied to the control electrode 61. In addition, as the highest sensitivity of the unit pixel cell 14 increases, a range within which sensitivity can be varied by the voltage applied to the control electrode 61 increases. In order to increase the highest sensitivity of the unit pixel cell 14, the area of the pixel electrode 50 is desirably increased to make the pixel electrode 50 close to the control electrode 61. A shortest distance between the center point C1 and the pixel electrode 50 may be, for example, half a radius of the circle B1 or shorter. In this case, a greater effect can be produced.

In addition to, or instead of, the above conditions, the control electrode 61 may overlap, in plan view, a point at which the microlens 55 is thickest. In FIG. 3, the point C1 is also an example of the point at which the microlens 55 is thickest. As illustrated in FIG. 3, by disposing the control electrode 61 such that the control electrode 61 overlaps the point C1 at which the microlens 55 is thickest, too, sensitivity can be varied over a wide range by the voltage applied to the control electrode 61.

Furthermore, in the present embodiment, there is a line segment connecting two points on the pixel electrode 50 to each other and overlapping the control electrode 61 in plan view. The line segment A1 illustrated in FIG. 3 is an example of such a segment. By disposing the electrodes such that such a line segment exists, the same effect can be produced, which will be described in detail later in a modification.

Operation of Imaging Device 101

Next, an exemplary operation of the imaging device 101 will be described with reference to FIGS. 1, 2, and 4A to 4D. As described hereinafter, when signal charge is holes, holes generated in the photoelectric conversion layer 51 can be collected in the pixel electrode 50 by setting potentials of the pixel electrode 50 and the control electrode 61 lower than that of the counter electrode 52.

First, a voltage of about 10 V is applied to the counter electrode 52. The reset transistor 12 is turned on and then off to reset the potential of the pixel electrode 50. As a result of the reset, a potential of the charge accumulation node 24 including the pixel electrode 50 is set to a reset voltage, namely 0 V, for example, as an initial value. In addition, the voltage application circuit 60 applies a first sensitivity adjusting voltage, which is lower than the reset voltage, for example, to the control electrode 61. Here, the voltage application circuit 60 applies a voltage of −2 V to the control electrode 61 as the first sensitivity adjusting voltage.

The potentials of the pixel electrode 50 and the control electrode 61 are thus set lower than that of the counter electrode 52. Holes generated in the photoelectric conversion layer 51 through photoelectric conversion, therefore, move to the control electrode 61 and the pixel electrode 50. Here, the voltage of the control electrode 61 is lower than the reset voltage of the pixel electrode 50. That is, a potential difference between the control electrode 61 and the counter electrode 52 is larger than that between the pixel electrode 50 and the counter electrode 52. The generated holes, therefore, are more likely to move to the control electrode 61 than to the pixel electrode 50. As a result, holes generated in a region 51B (refer to FIG. 4A) of the photoelectric conversion layer 51 including a part overlapping the pixel electrode 50 mainly move to the pixel electrode 50 and are detected as signal charge. Holes generated in a region 51A (refer to FIG. 4A) of the photoelectric conversion layer 51 including a part overlapping the control electrode 61, on the other hand, mainly move to the control electrode 61. This means that, of light radiated onto the photoelectric conversion layer 51, light radiated onto the region 51B is detected.

That is, the unit pixel cell 14 essentially detects, of incident light, light incident on the region 51B. The region 51B is a region of the photoelectric conversion layer 51 where signal charge (holes here) generated through photoelectric conversion is mainly collected in the pixel electrode 50. The region 51A is a region of the photoelectric conversion layer 51 where signal charge (holes here) generated through photoelectric conversion mainly moves to the control electrode 61.

Figure 4A:
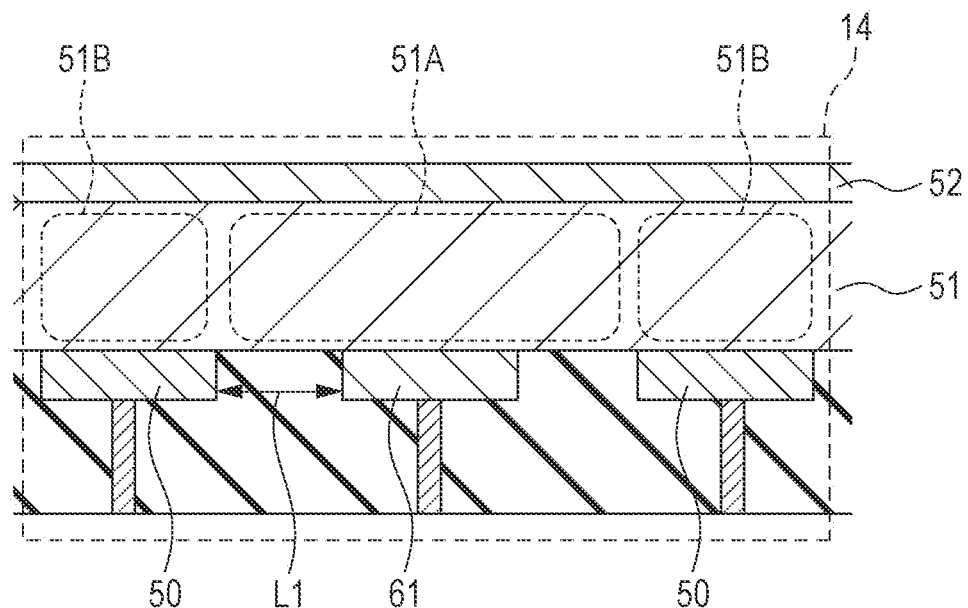
FIG. 4A is a schematic cross-sectional view illustrating an example of a region that is formed in a photoelectric conversion layer when a voltage is applied to the control electrode and where signal charge that can move to the pixel electrode exists.
Figure 4B:
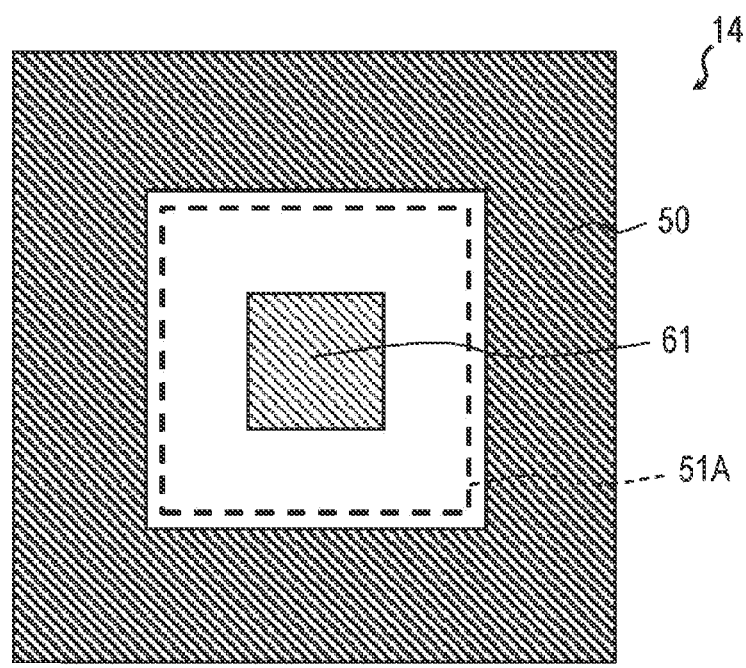
FIG. 4B is a schematic plan view illustrating the example of a region that is formed in the photoelectric conversion layer when a voltage is applied to the control electrode and where signal charge that can move to the pixel electrode exists.

FIG. 4B is a plan view of the region 51A viewed from a side of the pixel electrode 50 and the control electrode 61. In this example, the region 51A has a first area, which is slightly larger than the control electrode 61, in a plane parallel to the photoelectric conversion layer 51. As illustrated in FIG. 4B, a shape and the area of the region 51A when viewed from a direction perpendicular to the photoelectric conversion layer 51 do not necessarily match those of the control electrode 61. In addition, as described in detail later, the shape and/or the area of the region 51A can vary depending on voltages applied to the pixel electrode 50, the control electrode 61, and the counter electrode 52. The shape and the area of the region 51B when viewed from the direction perpendicular to the photoelectric conversion layer 51 do not necessarily match those of the pixel electrode 50, either. FIGS. 4A and 4B schematically illustrate the region 51A, and there is no clear boundary between the region 51A and the region 51B.

Signal charge is accumulated in each frame with the first sensitivity adjusting voltage applied to the control electrode 61, and then the accumulated charge and the potential of the pixel electrode 50 are reset. As a result, light incident on the photoelectric conversion layer 51 can be detected in the region 51B having a second area.

Figure 4C:
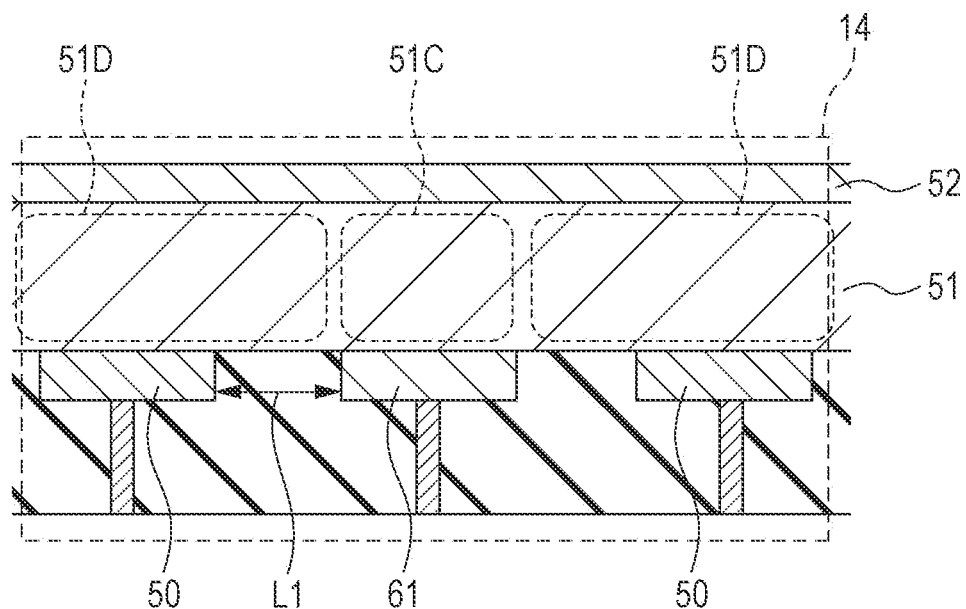
FIG. 4C is a schematic cross-sectional view illustrating an example of a region that is formed in the photoelectric conversion layer when another voltage is applied to the control electrode and where signal charge that can move to the pixel electrode exists.
Figure 4D:
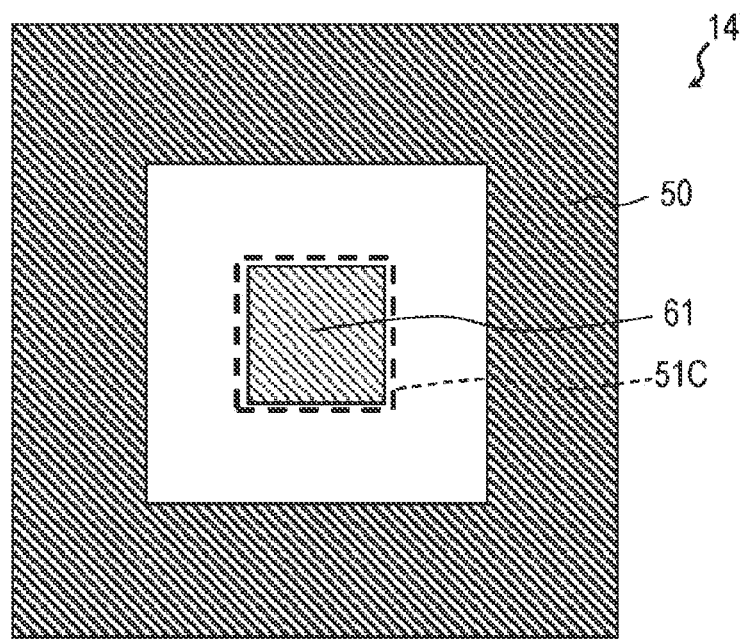
FIG. 4D is a schematic plan view illustrating the example of a region that is formed in the photoelectric conversion layer when another voltage is applied to the control electrode and where signal charge that can move to the pixel electrode exists.

FIGS. 4C and 4D illustrate an example where the voltage application circuit 60 applies a second sensitivity adjusting voltage, which is higher than the first sensitivity adjusting voltage, to the control electrode 61. For example, the second sensitivity adjusting voltage is 5 V.

In this example, too, as when the first sensitivity adjusting voltage is applied, holes generated in the photoelectric conversion layer 51 through photoelectric conversion move to the control electrode 61 and the pixel electrode 50. In this example, the second sensitivity adjusting voltage (5 V here) is higher than the reset voltage (0 V here). The holes generated in the photoelectric conversion layer 51, therefore, are more likely to move to the pixel electrode 50 than to the control electrode 61.

Furthermore, in this example, the second sensitivity adjusting voltage, which is higher than the first sensitivity adjusting voltage in the example described with reference to FIGS. 4A and 4B, is applied to the control electrode 61. Fewer holes, therefore, flow into the control electrode 61 than when the first sensitivity adjusting voltage is applied to the control electrode 61. That is, the generated holes are more likely to move to the pixel electrode 50. As a result, as schematically illustrated in FIG. 4C, a region 51D where holes that can move to the pixel electrode 50 are distributed is larger than the region 51B at a time when the first sensitivity adjusting voltage is applied to the control electrode 61.

A region 51D where holes that can move to the control electrode 61 are distributed is smaller than the region 51A (refer to FIG. 4A) at a time when the first sensitivity adjusting voltage is applied to the control electrode 61.

FIG. 4D is a plan view of the region 51C viewed from the side of the pixel electrode 50 and the control electrode 61. The region 51C has a third area, which is smaller than the first area, for example, in a plane parallel to the photoelectric conversion layer 51.

The region 51D has a fourth area, which is greater than the second area, for example, when viewed from the direction perpendicular to the photoelectric conversion layer 51.

Signal charge is accumulated in each frame with the second sensitivity adjusting voltage applied to the control electrode 61, and the accumulated charge and the potential of the pixel electrode 50 are reset. As a result, light incident on the photoelectric conversion layer 51 can be detected in the region 51D having the fourth area.

As described above, when the first sensitivity adjusting voltage is applied to the control electrode 61, the region 51B where the pixel electrode 50 captures signal charge is relatively small, and when the second sensitivity adjusting voltage is applied to the control electrode 61, the region 51D where the pixel electrode 50 captures signal charge is relatively large. That is, when the first sensitivity adjusting voltage is applied to the control electrode 61, the sensitivity of the imaging device 101 is relatively low, and when the second sensitivity adjusting voltage is applied to the control electrode 61, the sensitivity of the imaging device 101 is relatively high. The sensitivity of the imaging device 101 can thus be varied by varying the sensitivity adjusting voltage Vc applied to the control electrode 61.

When the unit pixel cell 14 includes a microlens, the microlens collects light in a central part of the unit pixel cell 14. More signal charge, therefore, is generated in the central part of the unit pixel cell 14 than in a peripheral part. In the present embodiment, the control electrode 61 is disposed in the central part of the unit pixel cell 14, and a destination of signal charge generated in the central part can be efficiently controlled by the voltage of the control electrode 61. As a result, sensitivity can be varied over a wider range.

The first sensitivity adjusting voltage and the second sensitivity adjusting voltage are examples, and the sensitivity adjusting voltage Vc is not limited to the above-mentioned values.

In the present embodiment, the control electrode 61, which is a third electrode, is used to control sensitivity with an electric field between two terminals, namely the charge accumulation node 24 or the pixel electrode 50 and the counter electrode 52, maintained high. A region where a photocurrent between the two terminals is saturated can be used. By using the region where a photocurrent is saturated, an effect upon the photocurrent can be reduced even when the potential of the pixel electrode 50 changes as a result of accumulation of signal charge. As a result, according to the present embodiment, sensitivity can be maintained substantially constant in relation to the sensitivity adjusting voltage Vc. This will be described in detail with reference to FIGS. 5 to 7.

Figure 5:
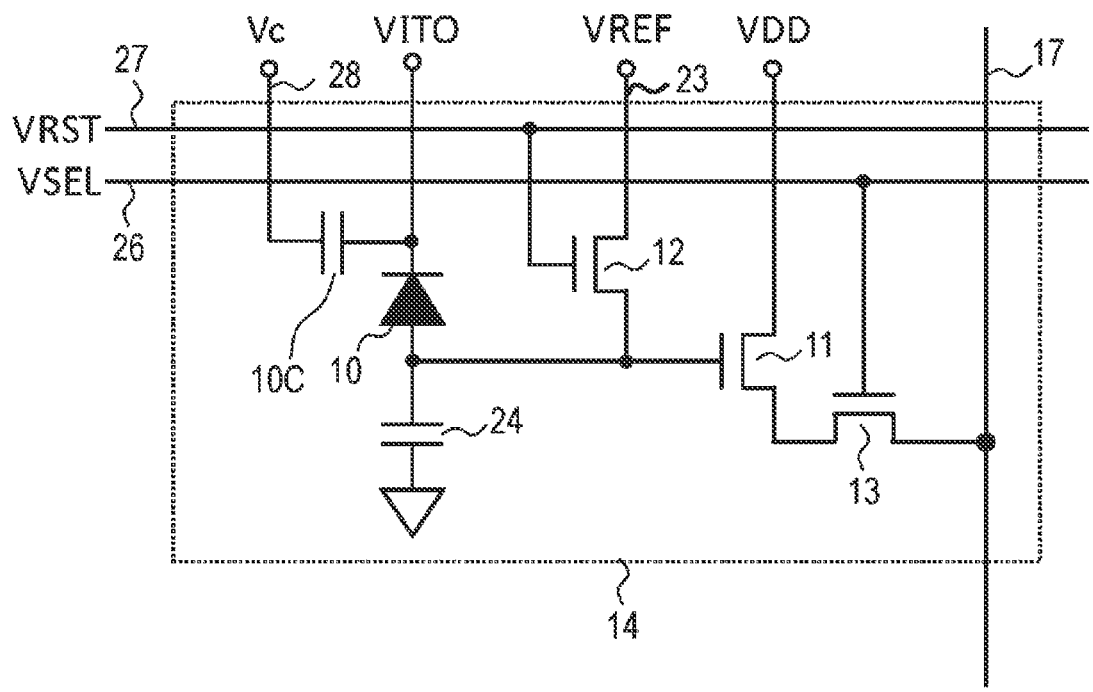
FIG. 5 is a diagram illustrating an example of the circuit configuration of the unit pixel cell in the imaging device according to the first embodiment.

FIG. 5 is a diagram illustrating an example of the circuit configuration of the unit pixel cell 14 in the imaging device 101 according to the present embodiment. Whereas FIG. 1 schematically illustrates the photoelectric converter 10, FIG. 5 illustrates the photoelectric converter 10 with equivalent circuit elements. In FIG. 5, the unit pixel cell 14 includes an amplifier transistor 11, a reset transistor 12, an address transistor 13, a multilayer film capacitor 10C, and a photoelectric converter 10. FIG. 5 also illustrates a reset gate voltage VRST of a reset signal line 27, a row selection signal VSELL of an address signal line 26, the sensitivity adjusting voltage Vc, a voltage VITO applied to the counter electrode 52, a reset voltage VREF supplied to the reset transistor 12, and a power supply voltage VDD supplied to the amplifier transistor 11.

As described above, the amplifier transistor 11, the reset transistor 12, and the address transistor 13 constitute a charge detection circuit 25.

One of two electrodes included in the multilayer film capacitor 10C corresponds to the control electrode 61, and the sensitivity adjusting voltage Vc is applied to the electrode. The other electrode corresponds to a part of the counter electrode 52 facing the control electrode 61. That is, the multilayer film capacitor 10C is a capacitor corresponding to a part of the photoelectric conversion layer 51 sandwiched between the control electrode 61 and the counter electrode 52.

The photoelectric converter 10 is equivalent to a photodiode as a photoelectric conversion device. A cathode of the photodiode corresponds to the counter electrode 52. An anode of the photodiode corresponds to the pixel electrode 50.

The charge accumulation node 24 is illustrated in FIG. 5 as a capacitor.

The control electrode 61 to which the sensitivity adjusting voltage Vc is applied has a small parasitic capacitance with respect to the pixel electrode 50, and therefore variation in the potential of the pixel electrode 50 due to changes in the sensitivity adjusting voltage Vc is small. The control electrode 61, on the other hand, includes the multilayer film capacitor 10C, which corresponds to the photoelectric conversion layer 51 regarded as a dielectric, for the counter electrode 52. Since the counter electrode 52 is connected to the voltage application circuit 60, however, even if the potential of the counter electrode 52 changes due to variation in the sensitivity adjusting voltage Vc, the potential immediately resets to a certain voltage. With this configuration, even if the sensitivity adjusting voltage Vc is changed, the potentials of the counter electrode 52 and the pixel electrode 50 hardly change.

Figure 6:
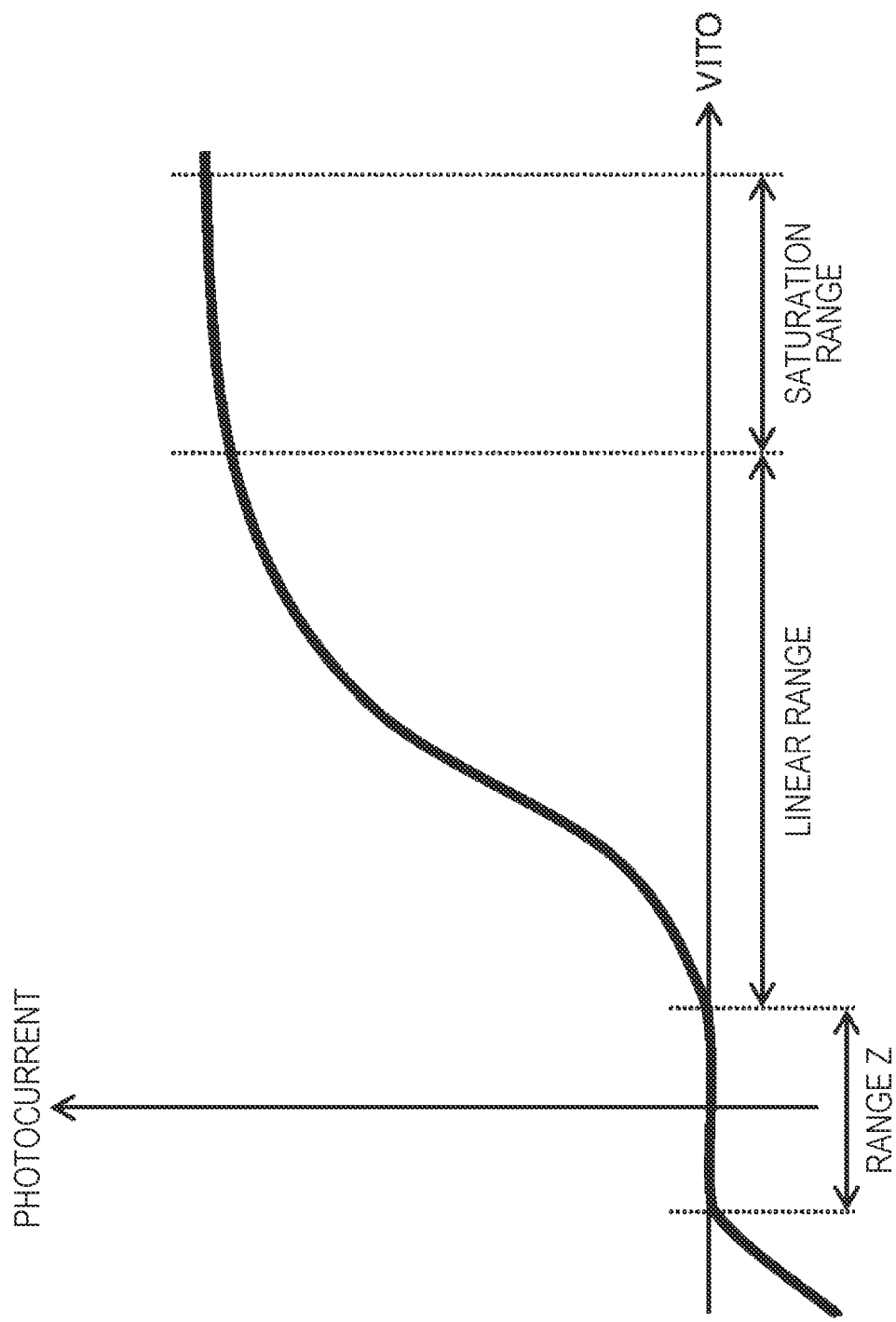
FIG. 6 is a diagram illustrating an example of a relationship between a potential difference between electrodes and a photocurrent in the imaging device according to the first embodiment.

FIG. 6 is a diagram illustrating an example of a relationship between a potential difference between electrodes and a photocurrent in the imaging device 101 according to the first embodiment. A horizontal axis in FIG. 6 represents the potential of the counter electrode 52 with respect to the pixel electrode 50, that is, a potential difference between the pixel electrode 50 and the counter electrode 52. A vertical axis represents the magnitude of a photocurrent based on charge generated by a constant amount of incident light. That is, a characteristic illustrated in FIG. 6 indicates a photocurrent-voltage characteristic between two terminals without presence of the control electrode 61 and the magnitude of the photocurrent at a time when the voltage VITO is changed under the constant amount of light.

The characteristic illustrated in FIG. 6 is roughly divided into a range Z, a linear range, and a saturation range in accordance with the magnitude of the voltage VITO. The range Z is a range where the voltage VITO is close to 0 V and the photocurrent hardly flows. In the linear range, the photocurrent substantially linearly increases as the voltage VITO increases. In the saturation range, the photocurrent does not change much even when the voltage VITO increases.

A range where the photocurrent is generated is divided into the linear range and the saturation range.

When light is radiated onto the photoelectric conversion device and the photocurrent is generated, the potential of the pixel electrode 50 changes as signal charge accumulates, and the potential difference between the pixel electrode 50 and the counter electrode 52 changes.

When the photoelectric conversion device is operated in the linear range, the photocurrent changes as the potential of the pixel electrode 50 changes. That is, because sensitivity varies in accordance with the amount of signal charge accumulated, linearity of signal output values is broken.

When the photoelectric conversion device operates in the saturation range, on the other hand, the photocurrent does not change much even when the potential of the pixel electrode 50 changes. Sensitivity, therefore, is maintained constant regardless of the amount of signal charge accumulated. Consequently, a signal output becomes linear with respect to the amount of incident light and accumulation time. The potential of the pixel electrode 50 can increase, at maximum, to substantially the same value as that of the counter electrode 52, but the potential of the pixel electrode 50 with which signal detection is possible is also limited by the voltage supplied to the amplifier transistor 11. By setting the potential of the counter electrode 52 sufficiently high, for example, the photoelectric conversion device can be operated in the saturation range within a range of the potential of the pixel electrode 50 with which signal detection is possible. In addition, even if the sensitivity adjusting voltage Vc is changed, the potential difference between the pixel electrode 50 and the counter electrode 52 hardly changes, and the linearity of signal output values is not broken as a result of accumulation of signal charge. A method for varying sensitivity with the sensitivity adjusting voltage Vc of the control electrode 61 is thus more suitable in the saturation range than in the linear range in that linearity can be secured.

Figure 7:
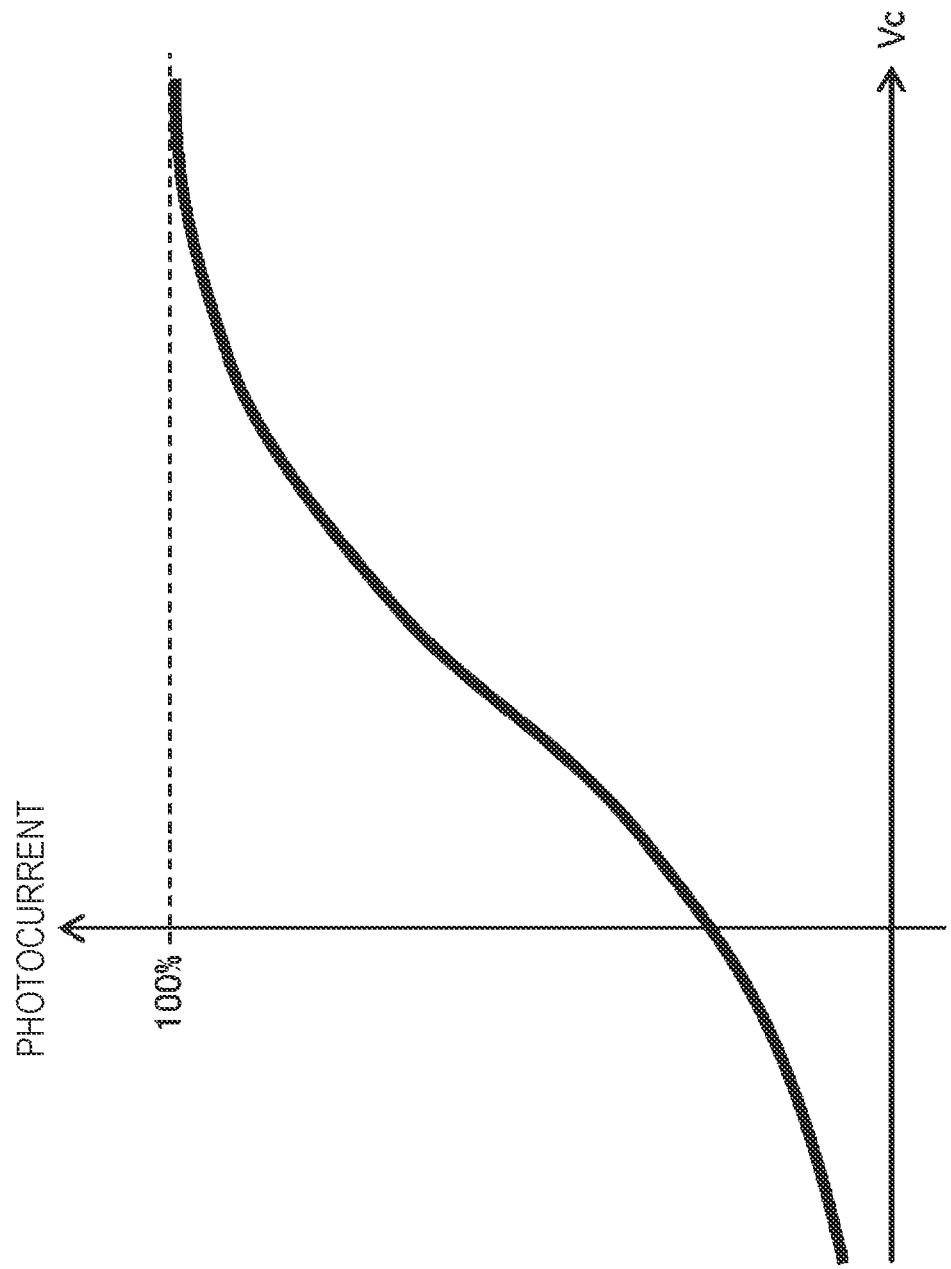
FIG. 7 is a diagram illustrating an example of a relationship between a voltage applied to the control electrode and the photocurrent in the imaging device according to the first embodiment.

FIG. 7 is a diagram illustrating an example of a relationship between the voltage applied to the control electrode 61 and the photocurrent in the imaging device 101 according to the first embodiment. A horizontal axis represents the sensitivity adjusting voltage Vc applied to the control electrode 61. The vertical axis represents the magnitude of the photocurrent corresponding to charge generated by a constant amount of incident light. FIG. 7, however, illustrates a case where the voltage VITO illustrated in FIG. 6 falls within the saturation range. That is, a photoelectric conversion characteristic illustrated in FIG. 7 indicates the magnitude of the photocurrent at a time when the voltage VITO falls within the saturation range illustrated in FIG. 6 and the sensitivity adjusting voltage Vc is changed under the constant amount of light.

When the sensitivity adjusting voltage Vc is high, holes generated in the photoelectric conversion layer 51 tend to flow to the pixel electrode 50. As a result, the photocurrent increases, and sensitivity increases. When the sensitivity adjusting voltage Vc becomes sufficiently high, almost all of the holes generated in the photoelectric conversion layer 51 flow to the pixel electrode 50, and changes in sensitivity slow down. When the sensitivity adjusting voltage Vc is low, on the other hand, holes generated in the photoelectric conversion layer 51 tend to flow to the control electrode 61. As a result, the photocurrent to the pixel electrode 50 decreases, and sensitivity decreases.

In the present embodiment, a slope illustrated in FIG. 7 as a distance L1 between the control electrode 61 and the pixel electrode 50 decreases. That is, sensitivity can be greatly varied with respect to the potential of the control electrode 61. In addition, as the area of the control electrode 61 increases, the amount of signal charge that can be controlled by the control electrode 61 increases, and sensitivity can be varied over a wider range.

Although signal charge is holes in the above embodiment, signal charge may be electrons, instead. When signal charge is electrons, voltages higher than that of the counter electrode 52 are applied to the pixel electrode 50 and the control electrode 61. As a result, electrons generated through photoelectric conversion move to the pixel electrode 50 and the control electrode 61. When signal charge is electrons, the electrons tend to flow to the pixel electrode and the sensitivity of the imaging device increases if the sensitivity adjusting voltage Vc applied to the control electrode is relatively low. If the sensitivity adjusting voltage Vc applied to the control electrode is relatively high, on the other hand, the electrons tend to flow to the control electrode and the sensitivity of the imaging device decreases.

The sensitivity of the imaging device 101 can thus be varied by adjusting the sensitivity adjusting voltage Vc. When signal charge is holes, the sensitivity of the imaging device becomes relatively low if the potential difference between the counter electrode 52 and the control electrode 61 is larger than that between the counter electrode 52 and the pixel electrode 50. If the potential between the counter electrode 52 and the control electrode 61 is smaller than that between the counter electrode 52 and the pixel electrode 50, on the other hand, the sensitivity of the imaging device becomes relatively high. This relationship holds true, too, when signal charge is electrons.

In addition, in the example described with reference to FIGS. 4A to 4D, the sensitivity adjusting voltage Vc applied to the control electrode 61 is changed between a value higher than the reset voltage of the pixel electrode 50 and a value lower than or equal to the reset voltage. The sensitivity of the imaging device 101, however, can also be varied even when the sensitivity adjusting voltage Vc applied to the control electrode 61 is changed within a range higher or lower than the reset voltage of the pixel electrode 50. When signal charge is holes and the sensitivity adjusting voltage Vc is changed within a range lower than the reset voltage of the pixel electrode 50, for example, the sensitivity of the imaging device decreases as the potential difference between the pixel electrode 50 and the control electrode 61 becomes relatively larger.

Modifications of Electrode Shapes

Modifications of the shapes and arrangement of the control electrode 61 and the pixel electrode 50 will be described with reference to FIGS. 8 to 12.

Figure 8:
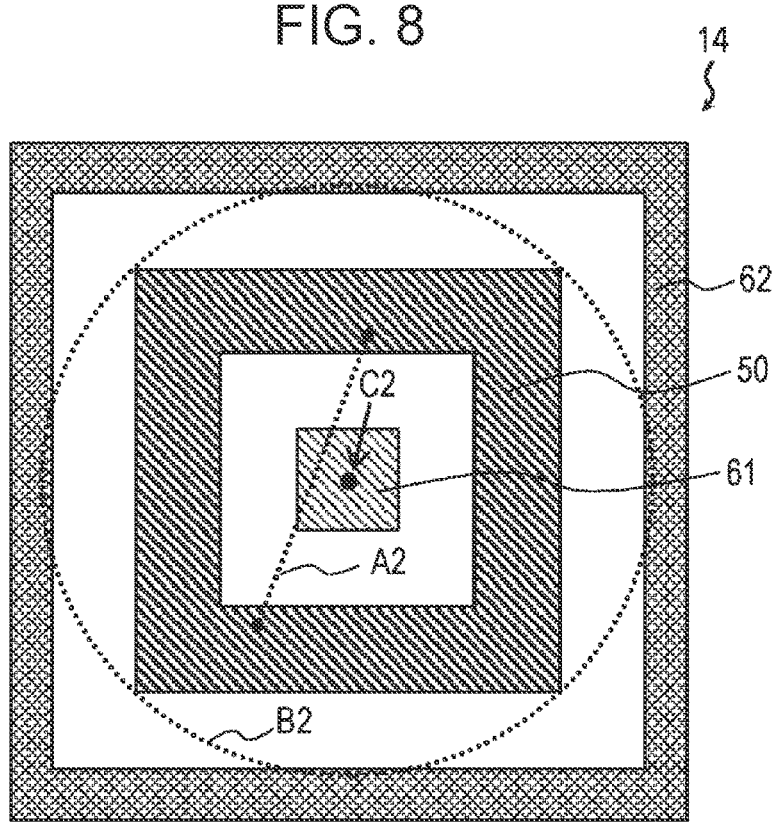
FIG. 8 is a diagram illustrating a first modification of shapes and the like of the control electrode and the pixel electrode in the imaging device according to the first embodiment.

FIG. 8 is a diagram illustrating a first modification of the shapes and the like of the control electrode 61 and the pixel electrode 50 in the imaging device 101 according to the first embodiment. A line segment A2 and a circle B2 indicated by broken lines are additional lines for explanation. The present modification is different from the example of arrangement illustrated in FIG. 3 in that a shield electrode 62 surrounding the pixel electrode 50 is added. A constant voltage is applied to the shield electrode 62. As a result, the shield electrode 62 prevents signal charge from moving between adjacent unit pixel cells 14, thereby preventing color mixing.

In the present modification, too, as illustrated in FIG. 8, the line segment A2 connecting two points on the pixel electrode 50 to each other and overlapping the control electrode 61 in plan view exists. In plan view, the control electrode 61 overlaps a center point C2 of the smallest circle B2 completely containing the pixel electrode 50. According to the present modification, too, the same effect as that described with reference to FIG. 3 can be produced.

The shield electrode 62 may be continuously formed over the plurality of unit pixel cell 14, instead. The shield electrode 62 may be independently provided for each row or each pixel, instead.

The shield electrode 62 may also be electrically connected to the control electrode 61. In this case, the number of independent power supplies can be reduced.

Figure 9:
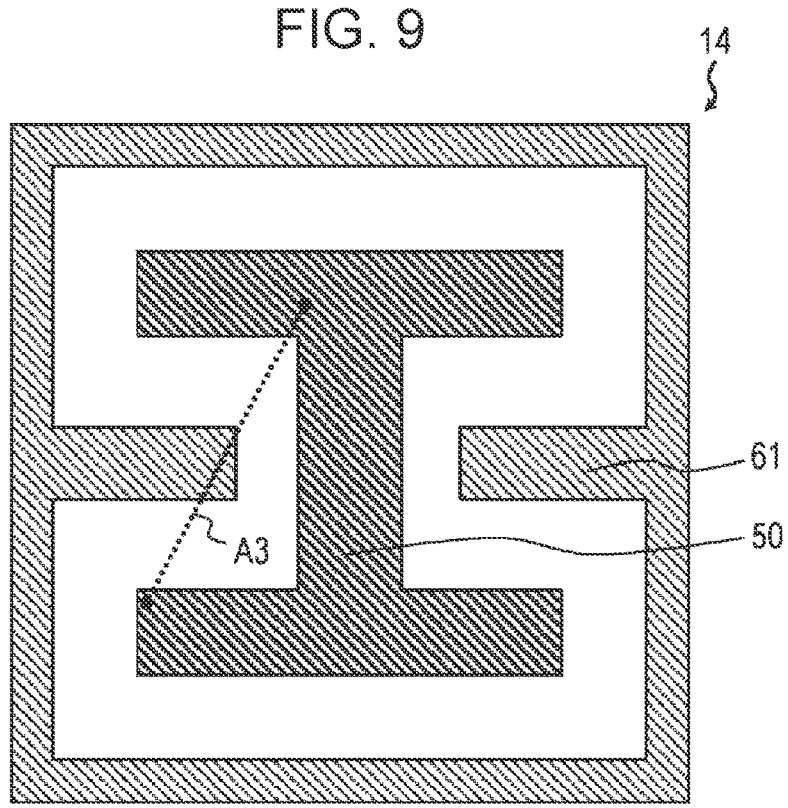
FIG. 9 is a diagram illustrating a second modification of the shapes and the like of the control electrode and the pixel electrode in the imaging device according to the first embodiment.

FIG. 9 is a diagram illustrating a second modification of the shapes and the like of the control electrode 61 and the pixel electrode 50 in the imaging device 101 according to the first embodiment. A line segment A3 indicated by a broken line is an additional line for explanation. In the present modification, the pixel electrode 50 has an H shape and is disposed at the center of the unit pixel cell 14. The control electrode 61 surrounds the pixel electrode 50 and has protrusions toward the pixel electrode 50. The protrusions of the control electrode 61 extend toward recesses of the pixel electrode 50 in such a way as to face the pixel electrode 50 on both sides thereof. That is, the protrusions of the control electrode 61 enter the recesses of the pixel electrode 50. In the present modification, there is a line segment connecting two points on the pixel electrode 50 to each other and overlapping the control electrode 61 in plan view. The line segment A3 illustrated in FIG. 9 is an example of such a line segment.

According to the present modification, sides on which the pixel electrode 50 and the control electrode 61 face each other in plan view are long. Changes in the amount of signal charge that moves to the pixel electrode 50 can be increased by the sensitivity adjusting voltage Vc applied to the control electrode 61. In addition, according to the present modification, the protrusions of the control electrode 61 are provided near the center of the unit pixel cell 14. The same effect as that described with reference to FIG. 3, therefore, can be produced. As a result, sensitivity can be varied over a wider range.

Figure 10:
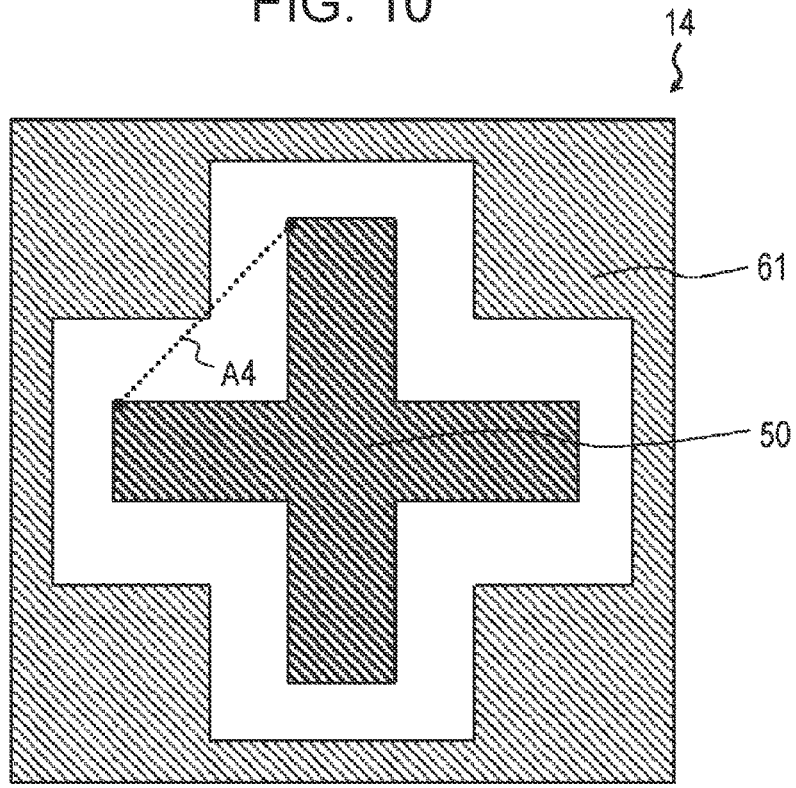
FIG. 10 is a diagram illustrating a third modification of the shapes and the like of the control electrode and the pixel electrode in the imaging device according to the first embodiment.

FIG. 10 is a diagram illustrating a third modification of the shapes and the like of the control electrode 61 and the pixel electrode 50 in the imaging device 101 according to the first embodiment. A line segment A4 indicated by a broken line is an additional line for explanation. In the present modification, the pixel electrode 50 has a shape of a cross and is disposed at the center of the unit pixel cell 14. The control electrode 61 surrounds the pixel electrode 50 and has protrusions toward the pixel electrode 50. The protrusions of the control electrode 61 extend toward recesses of the pixel electrode 50 in such a way as to face the pixel electrode 50 on both sides thereof. That is, the protrusions of the control electrode 61 enter the recesses of the pixel electrode 50. In the present modification, there is a line segment connecting two points on the pixel electrode 50 to each other and overlapping the control electrode 61 in plan view. The line segment A4 illustrated in FIG. 10 is an example of such a line segment.

According to the present modification, sides on which the pixel electrode 50 and the control electrode 61 face each other in plan view are long. Changes in the amount of signal charge that moves to the pixel electrode 50 can be increased by the sensitivity adjusting voltage Vc applied to the control electrode 61. In addition, according to the present modification, the protrusions of the control electrode 61 are provided near the center of the unit pixel cell 14. The same effect as that described with reference to FIG. 3, therefore, can be produced. As a result, sensitivity can be varied over a wider range.

Figure 11:
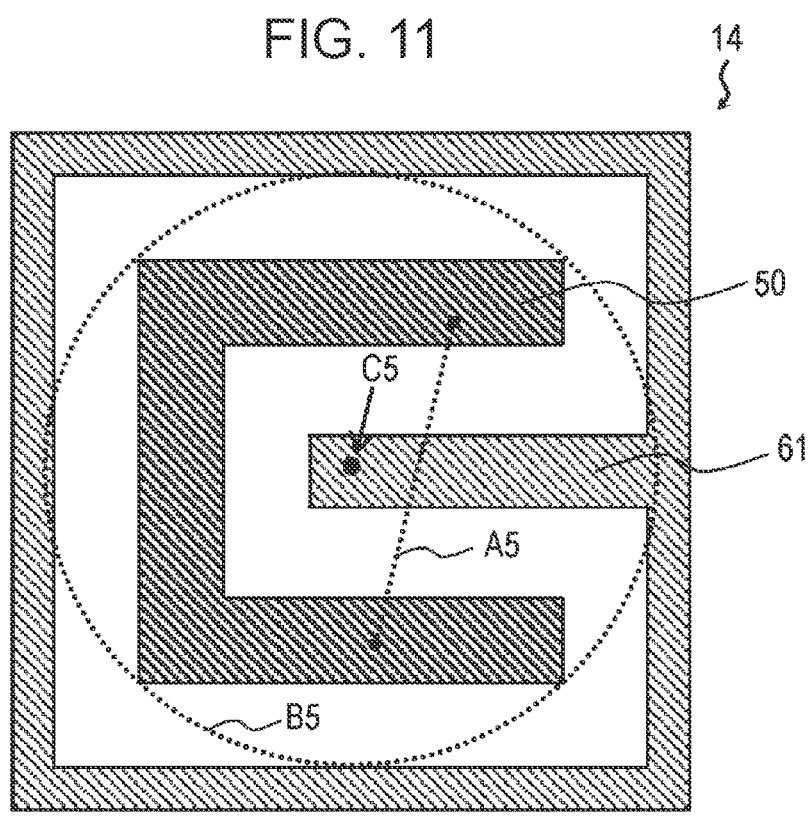
FIG. 11 is a diagram illustrating a fourth modification of the shapes and the like of the control electrode and the pixel electrode in the imaging device according to the first embodiment.

FIG. 11 is a diagram illustrating a fourth modification of the shapes and the like of the control electrode 61 and the pixel electrode 50 in the imaging device 101 according to the first embodiment. A line segment A5 and a circle B5 indicated by broken lines are additional lines for explanation. In the present modification, the pixel electrode 50 has a C shape. The control electrode 61 surrounds the pixel electrode 50 and has a protrusion toward the pixel electrode 50. The protrusion of the control electrode 61 extends toward a recess of the pixel electrode 50 in such a way as to face the pixel electrode 50 on both sides thereof. That is, the protrusion of the control electrode 61 enters the recess of the pixel electrode 50. In the present modification, there is a line segment connecting two points on the pixel electrode 50 to each other and overlapping the control electrode 61 in plan view. The line segment A5 illustrated in FIG. 11 is an example of such a line segment. In addition, in the present modification, the control electrode 61 overlaps a center point of a smallest circle completely containing the pixel electrode 50. In FIG. 11, the circle B5 is the smallest circle completely containing the pixel electrode 50. A point C5 is a center point of the circle B5. As illustrated in FIG. 11, the center point C5 of the circle B5 overlaps the control electrode 61.

According to the present modification, sides on which the pixel electrode 50 and the control electrode 61 face each other in plan view are long. Changes in the amount of signal charge that moves to the pixel electrode 50 can be increased by the sensitivity adjusting voltage Vc applied to the control electrode 61. In addition, according to the present modification, the protrusion of the control electrode 61 is provided near the center of the unit pixel cell 14. The same effect as that described with reference to FIG. 3, therefore, can be produced. As a result, sensitivity can be varied over a wider range.

Figure 12:
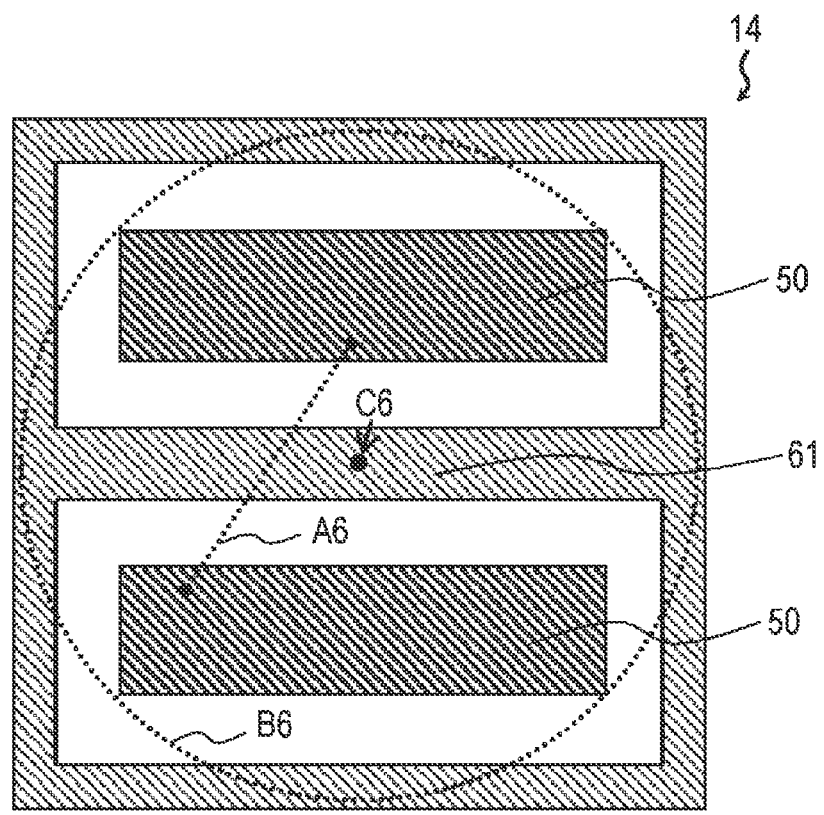
FIG. 12 is a diagram illustrating a fifth modification of the shapes and the like of the control electrode and the pixel electrode in the imaging device according to the first embodiment.

FIG. 12 is a diagram illustrating a fifth modification of the shapes and the like of the control electrode 61 and the pixel electrode 50 in the imaging device 101 according to the first embodiment. A line segment A6 and a circle B6 indicated by broken lines are additional lines for explanation. In the present modification, the unit pixel cells 14 of the imaging device 101 each include two rectangular pixel electrodes 50. The control electrode 61 surrounds each of the two pixel electrodes 50 and has a part extending between the two pixel electrodes 50. In the present modification, there is a line segment connecting two points on the pixel electrode 50 to each other and overlapping the control electrode 61 in plan view. The line segment A6 illustrated in FIG. 12 is an example of such a line segment. In addition, in the present modification, the control electrode 61 overlaps, in plan view, a center point of a smallest circle completely containing the pixel electrode 50. In FIG. 12, the circle B6 is the smallest circle completely containing the pixel electrode 50. A point C6 is a center point of the circle B6. As illustrated in FIG. 12, the center point C6 of the circle B6 overlaps the control electrode 61.

According to the present modification, sides on which the pixel electrode 50 and the control electrode 61 face each other in plan view are long. Changes in the amount of signal charge that moves to the pixel electrode 50 can be increased by the sensitivity adjusting voltage Vc applied to the control electrode 61. In addition, according to the present modification, a part of the control electrode 61 is provided near the center of the unit pixel cell 14. The same effect as that described with reference to FIG. 3, therefore, can be produced. As a result, sensitivity can be varied over a wider range.

Examples of Operation

Next, an exemplary method for driving the imaging device 101 will be described with reference to FIGS. 13 to 16. FIG. 13 is a timing chart illustrating an example of the operation of the imaging device 101 according to the first embodiment. FIG. 13 illustrates an example of timings of application of the sensitivity adjusting voltage Vc and exposure at a time when the sensitivity adjusting voltage Vc is changed in the imaging device 101.

In FIG. 13, RST1, RST2, RST3, RST4, ..., and RSTn are timings of gate voltages (also called reset gate voltages) applied to gate electrodes of reset transistors 12 included in first, second, third, fourth, ..., and n-th rows, respectively. The imaging device 101, for example, exposes and reads signals in units of rows. By applying the reset gate voltages, therefore, the charge accumulation nodes 24 of the unit pixel cells 14 in each row are sequentially reset in a period of one frame. A period until a reset gate voltage is applied in each of the rows of a pixel array after a previous reset gate voltage is applied corresponds to exposure time.

In the example illustrated in FIG. 13, the sensitivity adjusting voltage Vc applied to the control electrode 61 is changed at a beginning of a second frame. Here, the sensitivity adjusting voltage Vc applied to the control electrode 61 is controlled at the same timings not for each row but for the entirety of the pixel array. Whereas the sensitivity adjusting voltage Vc is controlled at the same timings for the entirety of the pixel array, a start of exposure for a row of pixels is different between the rows as can be seen from FIG. 13. The sensitivity adjusting voltage Vc, therefore, undesirably changes during the exposure time regardless of when the sensitivity adjusting voltage Vc applied to the control electrode 61 is changed. Sensitivity differs between the rows in a frame (the second frame here) in which the sensitivity adjusting voltage Vc has been changed, and the sensitivity adjusting voltage Vc changes during the exposure time. As a result, incident light is not detected with a correct level of sensitivity corresponding to the applied sensitivity adjusting voltage Vc. Image data captured in the second frame, in which the sensitivity adjusting voltage Vc has been changed, therefore, is discarded. In a next third frame, the changed sensitivity adjusting voltage Vc is applied to every row from a beginning of exposure. Incident light, therefore, can be detected with a correct level of sensitivity in every row.

As described above, by changing the sensitivity adjusting voltage Vc applied to the control electrode 61 at intervals of at least two frames, images with different levels of sensitivity can be obtained in units of frames. According to the present embodiment, therefore, the sensitivity of the imaging device can be varied in units of frames by changing the sensitivity adjusting voltage Vc supplied from the voltage application circuit. An imaging device capable of performing imaging with high image quality even in an environment where brightness greatly varies, therefore, can be achieved.

In addition, when the control electrodes 61 of the unit pixel cells 14 are connected to one another, the number of wires for driving the control electrodes 61 can be reduced.

In the operation described with reference to FIG. 13, the sensitivity adjusting voltage Vc applied to the control electrode 61 is changed in every two frames. The sensitivity adjusting voltage Vc, however, need not be switched in every two frames. As described hereinafter, the sensitivity adjusting voltage Vc may be switched in every frame, instead.

FIG. 14 is a timing chart illustrating another example of the operation of the imaging device 101 according to the first embodiment. FIG. 14 illustrates another example of the timings of application of the sensitivity adjusting voltage Vc, exposure, and reading of signals. In the example illustrated in FIG. 14, the voltage application circuit 60 switches, in each frame, the sensitivity adjusting voltage Vc from V0 to Vs and then to V0 again after a certain period of time Te elapses.

In this example, the voltage V0 is low enough to make the sensitivity of the imaging device 101 substantially zero. That is, when the voltage V0 is applied to the control electrode 61, the control electrode 61 captures most of signal charge (holes here) generated in the photoelectric conversion layer 51. In other words, when the voltage V0 is applied to the control electrode 61, a region (e.g., the region 51B illustrated in FIGS. 4A and 4B) where the pixel electrode 50 captures signal charge is sufficiently small, and the pixel electrode 50 captures only a small amount of signal charge. That is, by applying the voltage V0 to the control electrode 61, a state as if the photosensitive region is shaded can be achieved. By applying the voltage Vs, which is moderately higher than the voltage V0, to the control electrode 61, on the other hand, the region where the pixel electrode 50 captures signal charge can be moderately increased in size, and the imaging device 101 can achieve a level of sensitivity necessary for imaging.

In the example illustrated in FIG. 14, the voltage Vs is applied to the control electrode 61 in a certain period in each frame, and the voltage V0 is applied in another period. The pixel electrode 50, therefore, collects signal charge in a period other than ones where sensitivity is substantially zero, that is, where the voltage V0 is applied to the control electrode 61. That is, the period of time Te in each frame where the voltage Vs is applied to the control electrode 61 contributes, as effective exposure time, to accumulating signal charge.

As described above, according to this example of operation, effective exposure time can be adjusted with a period of time where the voltage Vs is applied to the control electrode 61. As illustrated in FIG. 14, the effective exposure time can be common to all the unit pixel cells 14. Exposure time in all the unit pixel cell included in the pixel array, therefore, can be aligned. That is, by changing the sensitivity adjusting voltage Vc in each frame, a function of a so-called global shutter can be achieved without separately providing a capacitor for accumulating signal charge, for example, in each pixel. A waveform of the sensitivity adjusting voltage Vc applied in the period of time Te is not limited to a rectangular pulse indicated by a solid line in FIG. 14, and may be a triangular wave indicated by a broken line, instead.

FIG. 15 is a timing chart illustrating yet another example of the operation of the imaging device 101 according to the first embodiment. FIG. 15 illustrates yet another example of the timings of application of the sensitivity adjusting voltage Vc, exposure, and reading of signals. As described with reference to FIG. 14, by applying the appropriate voltage V0 to the control electrode 61, the sensitivity of the imaging device 101 can be reduced to substantially zero. That is, the sensitivity adjusting voltage Vc applied to the control electrode 61 can be used like a shutter. In this example, too, as in the example described with reference to FIG. 14, signal charge is accumulated in periods where the voltage Vs is applied to the control electrode 61. Periods where the voltage V0 is applied to the control electrode 61 do not effectively contribute to obtaining an image.

In the example illustrated in FIG. 15, the voltage application circuit 60 periodically switches the sensitivity adjusting voltage Vc between V0 and Vs in each frame. Effective exposure time and non-exposure time, therefore, periodically alternate. When imaging is performed under a lighting device that flickers periodically, for example, an effect of the periodic flickering of the lighting device can be canceled by periodically changing the voltage applied to the control electrode 61.

FIG. 16 is a timing chart illustrating yet another example of the operation of the imaging device according to the first embodiment. FIG. 16 illustrates yet another example of the timings of application of the sensitivity adjusting voltage Vc, exposure, and reading of signals. In this example of operation, the sensitivity adjusting voltage Vc applied to the control electrode 61 is controlled at different timings between the rows. In FIG. 16, Vc1, Vc2, Vc3, Vc4, . . . , and Vcn are timings of changes of the sensitivity adjusting voltage Vc applied to the control electrodes 61 included in the unit pixel cells 14 in the first to n-th rows, respectively.

In this example of operation, as illustrated in FIG. 16, the sensitivity adjusting voltage Vc is changed in accordance with timings at which the reset gate voltage is switched from a high level to a low level, for example, in each of the rows of the pixel array. As a result, the sensitivity adjusting voltage Vc in each frame can be made constant in each of the rows of the unit pixel cells 14. That is, sensitivity can be varied in each frame in each of the rows.

In this example of operation, changes in the sensitivity adjusting voltage Vc during exposure time can be avoided. There are, therefore, no frames where imaging is not correctly performed, continuous frame imaging can be performed, and sensitivity can be adjusted in each frame. Since the imaging device according to the present embodiment can adjust the sensitivity thereof in each frame, for example, the imaging device can adjust the sensitivity thereof, even in an imaging environment where brightness rapidly changes, by responding to the changes in brightness fast.

The imaging device in the present disclosure is useful as an imaging device in a digital camera, an image sensor, or the like.

What is claimed is:
1. An imaging device comprising:
a photoelectric conversion layer that includes a first surface and a second surface opposite the first surface and that generates signal charge;
at least one pixel electrode located on the first surface of the photoelectric conversion layer;
a control electrode for controlling sensitivity of the imaging device, the control electrode being located on the first surface of the photoelectric conversion layer;
a counter electrode located on the second surface of the photoelectric conversion layer and opposite the at least one pixel electrode and the control electrode; and
a charge accumulator that is connected to the at least one pixel electrode and that accumulates the signal charge,
wherein there is a line segment connecting two points on the at least one pixel electrode to each other and overlapping the control electrode in plan view.
2. The imaging device according to claim 1,
wherein the at least one pixel electrode surrounds the control electrode in plan view.
3. The imaging device according to claim 1,
wherein the control electrode overlaps, in plan view, a center of a smallest circle completely containing the at least one pixel electrode.
4. The imaging device according to claim 1, further comprising:
a microlens located above the second surface.
5. The imaging device according to claim 4,
wherein the control electrode overlaps, in plan view, a point at which the microlens is thickest.

6. The imaging device according to claim 1,
wherein the photoelectric conversion layer includes an organic material.

7. The imaging device according to claim 1, further comprising:
a shield electrode that is located on the first surface and that surrounds the at least one pixel electrode and the control electrode in plan view.

8. The imaging device according to claim 7,
wherein the control electrode is electrically connected to the shield electrode.

9. The imaging device according to claim 1, further comprising:
a voltage supply circuit, wherein
the signal charge is a hole, and
the voltage supply circuit supplies a first voltage to the counter electrode and a second voltage to the control electrode, the second voltage being lower than the first voltage.

10. The imaging device according to claim 9,
wherein the voltage supply circuit supplies the second voltage to the control electrode in a first frame period and a third voltage to the control electrode in a second frame period that is different from the first frame period, the third voltage being lower than the second voltage.

11. An imaging device comprising:
a photoelectric conversion layer that includes a first surface and a second surface opposite the first surface and that generates signal charge;
at least one pixel electrode located on the first surface of the photoelectric conversion layer;
a control electrode for controlling sensitivity of the imaging device, the control electrode being located on the first surface of the photoelectric conversion layer;
a counter electrode located on the second surface of the photoelectric conversion layer and opposite the at least one pixel electrode and the control electrode; and
a charge accumulator that is connected to the at least one pixel electrode and that accumulates the signal charge,
wherein the control electrode overlaps, in plan view, a center of a smallest circle completely containing the at least one pixel electrode.

12. An imaging device comprising:
a photoelectric conversion layer that includes a first surface and a second surface opposite the first surface and that generates signal charge;
at least one pixel electrode located on the first surface of the photoelectric conversion layer;
a control electrode for controlling sensitivity of the imaging device, the control electrode being located on the first surface of the photoelectric conversion layer;
a counter electrode located on the second surface of the photoelectric conversion layer and opposite the at least one pixel electrode and the control electrode;
a microlens located above the second surface of the photoelectric conversion layer; and
a charge accumulator that is connected to the at least one pixel electrode and that accumulates the signal charge,
wherein the control electrode overlaps, in plan view, a point at which the microlens is thickest.

* * * * *